US010861893B2

(12) United States Patent
Maruyama

(10) Patent No.: US 10,861,893 B2
(45) Date of Patent: Dec. 8, 2020

(54) IMAGING ELEMENT AND IMAGING APPARATUS

(71) Applicant: SONY SEMICONDUCTOR SOLUTIONS CORPORATION, Kanagawa (JP)

(72) Inventor: Yasushi Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/760,277

(22) PCT Filed: Sep. 30, 2016

(86) PCT No.: PCT/JP2016/004435
§ 371 (c)(1),
(2) Date: Mar. 15, 2018

(87) PCT Pub. No.: WO2017/064845
PCT Pub. Date: Apr. 20, 2017

(65) Prior Publication Data
US 2018/0277584 A1    Sep. 27, 2018

(30) Foreign Application Priority Data

Oct. 14, 2015  (JP) ................................ 2015-202660

(51) Int. Cl.
*H01L 27/146*    (2006.01)
(52) U.S. Cl.
CPC .... *H01L 27/14629* (2013.01); *H01L 27/1464* (2013.01); *H01L 27/14605* (2013.01);
(Continued)

(58) Field of Classification Search
CPC ......... H01L 27/14629; H01L 27/14605; H01L 27/14625; H01L 27/14621;
(Continued)

(56) References Cited

U.S. PATENT DOCUMENTS

| 2009/0250777 A1* | 10/2009 | Takamiya | ......... H01L 27/14625 |
| | | | 257/432 |
| 2012/0287297 A1* | 11/2012 | Fukuda | ................ G02B 5/3058 |
| | | | 348/222.1 |
| 2012/0319222 A1* | 12/2012 | Ozawa | .............. H01L 27/14605 |
| | | | 257/432 |

FOREIGN PATENT DOCUMENTS

| EP | 2252069 | 11/2010 |
| JP | 2007-052315 | 3/2007 |

(Continued)

OTHER PUBLICATIONS

International Search Report prepared by the European Patent Office dated Dec. 20, 2016, for International Application No. PCT/JP2016/004435.

(Continued)

*Primary Examiner* — Thanh T Nguyen
(74) *Attorney, Agent, or Firm* — Sheridan Ross P.C.

(57) ABSTRACT

There is provided an imaging element including a photoelectric conversion unit formed in a substrate and a wire grid polarizer disposed at a light-incident side of the photoelectric conversion unit. In addition, the wire grid polarizer includes a plurality of strip-shaped portions, where air gaps exist between adjacent strip-shaped portions. Further, a protective layer is formed on the wire grid polarizer.

20 Claims, 34 Drawing Sheets

(52) U.S. Cl.
CPC .. *H01L 27/14621* (2013.01); *H01L 27/14623* (2013.01); *H01L 27/14625* (2013.01); *H01L 27/14627* (2013.01); *H01L 27/14636* (2013.01); *H01L 27/14685* (2013.01)

(58) Field of Classification Search
CPC ......... H01L 27/14627; H01L 27/14685; H01L 27/1464; H01L 27/14636; H01L 27/14623
See application file for complete search history.

(56) References Cited

FOREIGN PATENT DOCUMENTS

| | | |
|---|---|---|
| JP | 2008-177191 | 7/2008 |
| JP | 2010-049280 | 3/2010 |
| JP | 2010-263158 | 11/2010 |
| JP | 2012-098469 | 5/2012 |
| JP | 2012-169530 | 9/2012 |
| JP | 2012-238632 | 12/2012 |
| JP | 2014-164263 | 9/2014 |
| JP | 2015-106149 | 6/2015 |
| JP | 2015-170732 | 9/2015 |
| WO | WO 2007/011047 | 1/2007 |

OTHER PUBLICATIONS

Official Action (with English translation) for Japanese Patent Application No. 2015-202660, dated Oct. 23, 2019, 14 pages.

\* cited by examiner

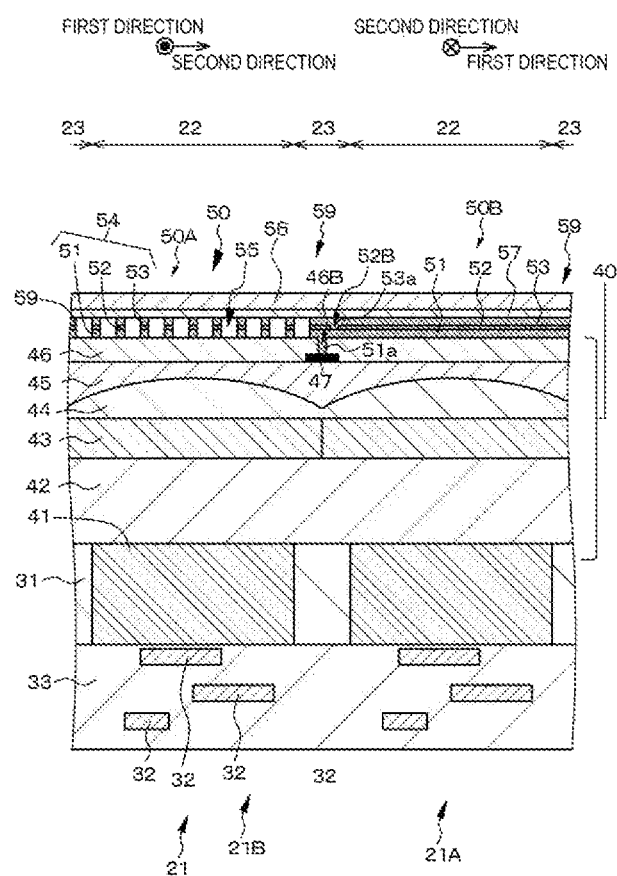

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2016/004435 having an international filing date of 30 Sep. 2016, which designated the United States, which PCT application claimed the benefit of Japanese Priority Patent Application JP 2015-202660 filed on Oct. 14, 2015, the disclosures of each of which are incorporated herein by reference.

TECHNICAL FIELD

The present disclosure relates to an imaging element and an imaging apparatus including the imaging element.

BACKGROUND ART

There is known an imaging apparatus including a plurality of imaging elements with wire grid polarizers (WGP) as described in JP 2012-142501A, for example. A photoelectric conversion region included in a photoelectric conversion unit of the imaging element to generate electric current on the basis of incident light is formed from a charge coupled device (CCD) and a complementary metal oxide semiconductor (CMOS) image sensor, for example. The wire grid polarizer is disposed on the light-incident side of the photoelectric conversion unit and has a line-and-space structure. For the sake of convenience, the direction in which the line-and-space structure extends will be called "first direction," and the direction in which the line parts are repeated (the direction orthogonal to the first direction) will be called "second direction."

As illustrated in the conceptual view of FIG. 37, when a formation pitch $P_0$ of the wire grid is significantly smaller than wavelength $\lambda_0$ of incident electromagnetic waves, the electromagnetic wave vibrating on a plane parallel to the direction of extension of the wire grid is selectively reflected on or absorbed in the wire grid. In this example, the distance between the line parts (distance or length between the space parts along the second direction) constitutes the formation pitch $P_0$ of the wire grid. Accordingly, as illustrated in FIG. 37, the electromagnetic wave having reached the wire grid polarizer includes a vertical polarization component and a lateral polarization component, and the electromagnetic wave having passed through the wire grid polarizer becomes linearly polarized light in which the vertical polarization component is dominant. When a visible light wavelength band is focused, if the formation pitch $P_0$ of the wire grid is significantly smaller than effective wavelength $\lambda_{eff}$ of the electromagnetic wave incident on the wire grid polarizer, the polarization component biased to the plane parallel to the first direction is reflected on or absorbed in the surface of the wire grid. Meanwhile, when the electromagnetic wave having a polarization component biased to the plane parallel to the second direction enters the wire grid, an electric field propagates the surface of the wire grid and passes through the wire grid from the back surface with the same wavelength as the incident wavelength and the same polarization orientation as the incident polarization orientation. When the average refractive index determined on the basis of the substance existing in the space parts is designated as $n_0$, the effective wavelength $\lambda_{eff}$ is expressed as $(\lambda_0/n_0)$. The average refractive index $n_0$ takes a value obtained by adding up the products of the refractive index and the volume of the substances existing in the space parts and then dividing the resultant by the volume of the space parts. When the value of the wavelength $\lambda_0$ is constant, the smaller the value of the $n_0$ is, the larger the value of the effective wavelength $\lambda_{eff}$ becomes. Therefore, the value of the formation pitch $P_0$ can be increased. In addition, the larger value of $n_0$ results in lower transmittance and lower extinction ratio of the wire grid polarizer.

CITATION LIST

Patent Literature

PTL 1: JP 2012-142501A

SUMMARY

Technical Problem

There is strong demand for improvement in transmittance and extinction ratio of the wire grid polarizer. Meanwhile, in the manufacture of the wire grid polarizer, there is a problem that portions of the outer periphery of the wire grid polarizer corresponding to the four corners of the imaging element frequently separate from the photoelectric conversion unit, and a problem that a structural difference occurs between the outer periphery of the wire grid polarizer and the central part of the wire grid polarizer to reduce the performance of the wire grid polarizer. Further, the light incident on the outer periphery of the wire grid polarizer is likely to leak to the adjacent imaging element with a different direction of polarization. According to the technique described in the foregoing patent literature, an insulation layer is formed on the side surfaces of the line parts in the wire grid polarizer to improve reliability. However, the foregoing patent literature includes no mention about the demand for an improvement in transmittance and extinction ratio of the wire grid polarizer and/or the associated problems.

Therefore, it is firstly desirable to provide an imaging element having a configuration and a structure capable of attaining improvement in transmittance and extinction ratio and an imaging apparatus including the imaging element. In addition, it is secondly desirable to provide an imaging element having a configuration and a structure with no problem at the outer periphery of the wire grid polarizer and an imaging apparatus including the imaging element.

Solution to Problem

According to a first embodiment of the present disclosure, there is provided an imaging element including:
a photoelectric conversion unit formed on a substrate;
a wire grid polarizer that is disposed on the light-incident side of the photoelectric conversion unit and has a line-and-space structure; and
a protective layer formed on the wire grid polarizer,
wherein space parts of the wire grid polarizer are air gaps.
That is, the space parts are filled at least with the air, where the air includes one or more elements that is in at least one of a gaseous or vapor state. An example of air includes, but is not limited to, atmospheric air including nitrogen, oxygen, argon, carbon dioxide, and small amounts of other gases with or without water vapor. Another example of air may include one or more of nitrogen, oxygen, argon, carbon dioxide, and helium.

As another example, one or more noble gases, together with one or more other elements in a gaseous state and/or vapor state, may be included in the air. Further, the air gap (space part 55) may be disposed between the protective layer 56 and an insulation layer 46.

According to the first embodiment of the present disclosure, there is provided an imaging apparatus including in an imaging region a plurality of imaging elements including:
a photoelectric conversion unit formed on a substrate;
a wire grid polarizer that is disposed on the light-incident side of the photoelectric conversion unit and has a line-and-space structure; and a protective layer formed on the wire grid polarizer, wherein space parts of the wire grid polarizer are air gaps.

According to the first embodiment of the present disclosure, there is provided an imaging element including:
a photoelectric conversion unit formed in a substrate;
a wire grid polarizer disposed at a light-incident side of the photoelectric conversion unit, the wire grid polarizer including a plurality of strip-shaped portions; and
a protective layer formed on the wire grid polarizer, wherein the wire grid polarizer includes air gaps between adjacent strip-shaped portions of the plurality of strip-shaped portions.

According to the first embodiment of the present disclosure, there is provided a method of manufacturing an imaging element, the method including:
forming a photoelectric conversion unit in a substrate;
forming a wire grid polarizer at a light-incident side of the photoelectric conversion unit, the wire grid polarizer including a plurality of strip-shaped portions; and forming a protective layer formed on the wire grid polarizer, wherein the wire grid polarizer includes air gaps between adjacent strip-shaped portions of the plurality of strip-shaped portions.

According to the first embodiment of the present disclosure, there is provided an imaging apparatus including an imaging region and a plurality of imaging elements, each imaging element including:
a photoelectric conversion unit formed on a substrate;
a wire grid polarizer disposed at a light-incident side of the photoelectric conversion unit, the wire grid polarizer including a plurality of strip-shaped portions; and
a protective layer formed on the wire grid polarizer, wherein the wire grid polarizer includes air gaps between adjacent strip-shaped portions of the plurality of strip-shaped portions.

According to a second embodiment of the present disclosure, there is provided an imaging element including:
a photoelectric conversion unit;
a wire grid polarizer that is disposed on the light-incident side of the photoelectric conversion unit and has a line-and-space structure; and,
a frame part surrounding the wire grid polarizer, wherein the frame part and line parts of the wire grid polarizer are coupled together, and
the frame part is structured in the same manner as the line parts of the wire grid polarizer.

According to the second embodiment of the present disclosure, there is provided an imaging apparatus including in an imaging region a plurality of imaging elements including:
a photoelectric conversion unit;
a wire grid polarizer that is disposed on the light-incident side of the photoelectric conversion unit and has a line-and-space structure; and
a frame part surrounding the wire grid polarizer, wherein the frame part and line parts of the wire grid polarizer are coupled together, and
the frame part is structured in the same manner as the line parts of the wire grid polarizer.

Advantageous Effects of Invention

In the imaging element or the imaging apparatus according to the first embodiment of the present disclosure, the space parts of the wire grid polarizer are air gaps to reduce the value of the average refractive index $n_0$. The air gaps may be filled with air, where the air includes one or more elements that is in at least one of a gaseous or vapor state. As a result, it is possible to improve the transmittance and the extinction ratio of the wire grid polarizer. In addition, the value of the formation pitch $P_0$ can be increased, and the manufacturing yield of the wire grid polarizer can be improved. Further, the wire grid polarizer has the protective layer thereon, thereby providing the imaging element and the imaging apparatus with high reliability. In the imaging element and the imaging apparatus according to the second embodiment of the present disclosure, the frame part and the line parts of the wire grid polarizer are coupled together, and the frame part is structured in the same manner as the line parts of the wire grid polarizer. Therefore, it is possible to provide the imaging element and the imaging apparatus with high reliability, not causing the problem that portions of the outer periphery of the wire grid polarizer corresponding to the four corners of the imaging element frequently separate from the photoelectric conversion unit, the problem that a structural difference occurs between the outer periphery of the wire grid polarizer and the central part of the wire grid polarizer to reduce the performance of the wire grid polarizer, and the problem that the light incident on the outer periphery of the wire grid polarizer is likely to leak to the adjacent imaging element with a different direction of polarization. The advantageous effects described herein are merely examples, not limited ones, and may have any other additional effects.

BRIEF DESCRIPTION OF DRAWINGS

FIG. 15 is a schematic partial end surface view of imaging elements in an imaging apparatus of example 4.

FIG. 37 is a conceptual view for describing light passing through the wire grid polarizer and the like.

DESCRIPTION OF EMBODIMENTS

Figure 1:
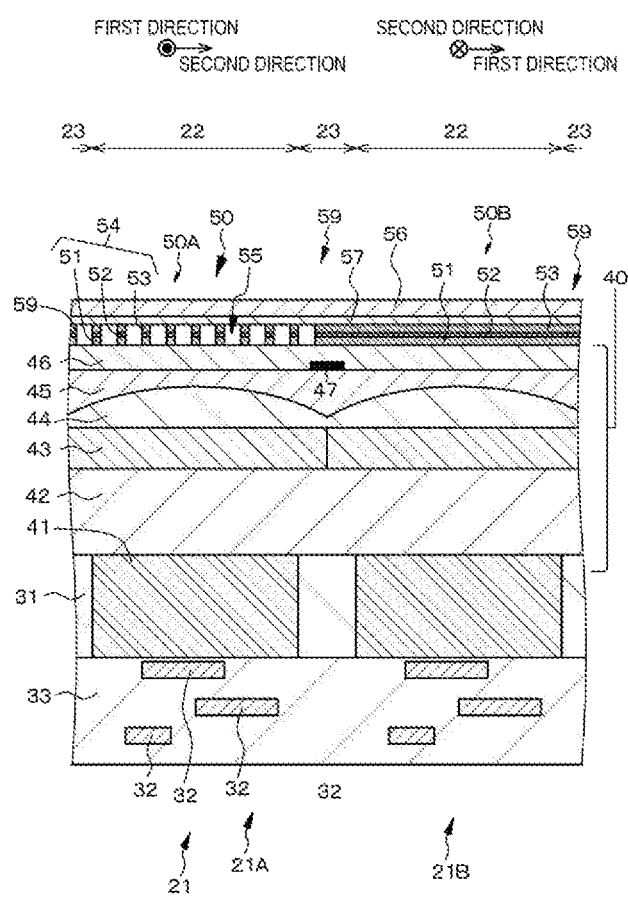
FIG. 1 is a schematic partial end surface view of imaging elements in an imaging apparatus of example 1.

The present disclosure will be explained below on the basis of examples with reference to the drawings. However, the present disclosure is not limited to the examples but various numerical values and materials in the examples are merely exemplifications. The explanation will be given in the following order:

1. General explanation of an imaging element and an imaging apparatus according to a first embodiment of the present disclosure, and an imaging element and an imaging apparatus according to a second embodiment of the present disclosure 2. Example 1 (the imaging element and the imaging apparatus according to the first embodiment of the present disclosure, and the imaging element and the imaging apparatus according to the second embodiment of the present disclosure, an imaging element-A, an imaging element and the like according to a first-A embodiment, an imaging element and the like according to a first-D embodiment, an imaging element and the like according to a second-A embodiment, and an imaging element and the like according to a second-D embodiment)

3. Example 2 (a modification example of the example 1 and an imaging element-B of the present disclosure)

4. Example 3 (modification examples of the examples 1 and 2, an imaging element and the like according to the first-B embodiment, and an imaging element and the like according to the second-B embodiment)

5. Example 4 (modification examples of the examples 1 to 3, an imaging element according to a first-C embodiment, and an imaging element and the like according to a second-C embodiment)

6. Others

General Explanation of an Imaging Element and an Imaging Apparatus According to a First Embodiment of the Present Disclosure, and an Imaging Element and an Imaging Apparatus According to a Second Embodiment of the Present Disclosure In the imaging element according to the first embodiment of the present disclosure or the imaging element in the imaging apparatus according to the first embodiment of the present disclosure (hereinafter, these imaging elements will be called collectively "the imaging element and the like according to the first embodiment of the present disclosure"), a second protective layer is formed between the wire grid polarizer and the protective layer. When the refractive index of the material for the protective layer is designated as $n_1$ and the refractive index of the material for the second protective layer is designated as $n_2$, the relationship $n_1 > n_2$ can be satisfied. By satisfying $n_1 > n_2$, the value of the average refractive index $n_0$ can be reliably reduced. Preferably, the protective layer is made from SiN and the second protective layer is formed from $SiO_2$ or SiON.

In the imaging element and the like according to the first embodiment of the present disclosure including the foregoing various preferred embodiments, a third protective layer may be formed at least on the side surfaces of the line parts facing the space parts of the wire grid polarizer. That is, the space parts are filled with the air and the third protective layer exists on the space parts, where the air includes one or more elements that is in at least one of a gaseous or vapor state. Materials for the third protective layer desirably have a refractive index of 2 or less and an extinction coefficient close to zero, and may be insulating materials such as $SiO_2$ including one or more of $TEOS-SiO_2$, SiON, SiN, SiC, SiOC, and SiCN, and metals oxides including one or more of aluminum oxide ($AlO_x$), hafnium oxide ($HfO_x$), zirconium oxide ($ZrO_x$), and tantalum oxide ($TaO_x$). Alternatively, the materials may be perfluorodecyltrichlorosilane or octadecyltrichlorosilane. The third protective layer can be formed by any of known processes such as various CVD methods, application methods, various PVD methods including sputtering methods and vacuum evaporation methods, sol-gel methods. Among them, the third protective layer is formed preferably by using an atomic layer deposition method (ALD method) or an HDP-CVD method (high density plasma chemical vapor deposition method). By using the ALD method, the thin third protective layer can be formed on the wire grid polarizer in a conformal manner. However, from the viewpoint of forming the thinner third protective layer on the side surfaces of the line parts, using the HDP-CVD method is further preferred. Alternatively, the refractive index of the third protective layer can be reduced by filling the space parts with the materials for the third protective layer and providing gaps, holes, voids, or the like in the third protective layer.

When the metallic materials or the alloy materials for the wire grid polarizer (hereinafter, also called "metallic material and the like") contacts the external air, the corrosion resistance of the metallic materials or the like may be deteriorated due to attachment of moisture and organic substances from the external air to reduce the long-term reliability of the imaging element. In particular, when water attaches to the line parts of the metallic material and the like, the insulating material, and the metallic material and the like, the water acts as an electrolyte solution because $CO_2$ and $O_2$ are dissolved in the water, and a local cell may be generated between the two kinds of metals. Then, at the time of occurrence of such a phenomenon, a reduction reaction such as hydrogen generation progresses on the cathode (positive polarity) side, and oxidation reaction progresses on the anode (negative polarity) side, thereby leading to anomalous deposition of the metallic materials and the like and shape variation of the wire grid polarizer. Then, as a result, the expected performance of the wire grid polarizer and the imaging element may not be provided. For example, when aluminum (Al) is used for a light reflection layer, the anomalous deposition of the aluminum may take place as shown by the following reaction formula. However, the formation of the protective layers and the third protective layer makes it possible to reliably avoid the occurrence of this problem.

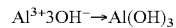

In the imaging element and the like according to the first embodiment of the present disclosure including the various preferred embodiments explained above, a frame part surrounding the wire grid polarizer may further be included, the frame part and the line parts of the wire grid polarizer may be coupled together, and the frame part may be structured in the same manner as the line parts of the wire grid polarizer. The imaging element and the like configured in such a manner according to the first embodiment of the present disclosure will be called "the imaging element and the like according to the first-A embodiment" for the sake of convenience.

Further, in the imaging element and the like according to the first embodiment of the present disclosure including the various preferred embodiments explained above, a drive circuit driving a photoelectric conversion unit may be formed on one surface of a substrate, the photoelectric conversion unit may be formed on the other surface of the substrate, and a groove part with an insulating material and/or a light-shielding material embedded therein (a kind of element separation region) may be formed at an edge portion of the imaging element in such a manner as to range from the one surface to the other surface of the substrate and further extend up to the lower side of the wire grid polarizer. The imaging element and the like configured in such a manner according to the first embodiment of the present disclosure will be called "the imaging element and the like according to the first-B embodiment" for the sake of convenience. The insulating material may be a material for an insulation layer (insulation layer formative layer) and an inter-layer insulation layer described later. The light-shielding material may be a material for a light-shielding layer described later. It is similarly applicable to the imaging element and the like according to the second-B embodiment described later. By forming the groove part, it is possible to prevent the reduction of sensitivity, the generation of polarization crosstalk, and the decrease of extinction ratio.

Further, in the imaging element and the like according to the first embodiment of the present disclosure including the various preferred embodiments explained above, the line parts of the wire grid polarizer may be formed from a layered structure in which a light reflection layer and an insulation layer made from a first conductive material and a light-absorption layer made from a second conductive material are layered from the photoelectric conversion unit side. In addition, a foundation film with a layered structure of Ti, TiN, or Ti/TiN may be formed between the photoelectric conversion unit and the light reflection layer. This increases irregularities, for example roughness, of a light reflection layer formative layer and the light reflection layer. In addition, in this case, an extension part of the light reflection layer may be electrically connected to the substrate or the photoelectric conversion unit. The imaging element and the like configured in such a manner according to the first embodiment of the present disclosure will be called "the imaging element and the like according to the first-C embodiment" for the sake of convenience. By electrically connecting the extension part of the light reflection layer to the substrate or the photoelectric conversion unit, it is possible to reliably avoid the occurrence of a problem where the light reflection layer formative layer and a light-absorption layer formative layer described later become electrically charged and generate a sort of electric discharge which may cause damage to the wire grid polarizer and the photoelectric conversion unit. It is similarly applicable to the imaging element and the like according to the second-C embodiment described next. In these configurations of the imaging element and the like according to the first embodiment of the present disclosure, the insulation layer may be formed on the entire top surface of the light reflection layer, and the light-absorption layer may be formed on the entire top surface of the insulation layer. The imaging element and the like configured in such a manner according to the first embodiment of the present disclosure will be called "the imaging element and the like according to the first-D embodiment" for the sake of convenience. Accordingly, the entire regions of the light-absorption layer and the light reflection layer are electrically connected to the substrate or the photoelectric conversion layer, which makes it possible to prevent the occurrence of electrical discharge in a more reliable manner. It is similarly applicable to the imaging element and the like according to the second-D embodiment described next. Alternatively, the wire grid polarizer may not have the insulation layer but may be formed by layering the light reflection layer and the light-absorption layer from the photoelectric conversion unit side. It is similarly applicable to the imaging element and the like according to the second-D embodiment described next.

In the imaging element according to the second embodiment of the present disclosure or the imaging element in the imaging apparatus according to the second embodiment of the present disclosure (hereinafter, these imaging elements will be collectively called "the imaging element and the like according to the second embodiment of the present disclosure"), the line parts of the wire grid polarizer may be formed from a layered structure in which the light reflection layer and the insulation layer made from the first conductive material and the light-absorption layer made from the second conductive material are layered from the photoelectric conversion unit side. As described above, a foundation film with a layered structure of Ti, TiN, or Ti/TiN may be formed between the photoelectric conversion unit and the light reflection layer. Then, in this case, the extension part of the light reflection layer may be electrically connected to the substrate or the photoelectric conversion unit. The imaging element and the like configured in such a manner according to the second embodiment of the present disclosure will be called "the imaging element and the like according to the second-C embodiment" for the sake of convenience. Further, in these configurations of the imaging element and the like according to the second embodiment of the present disclosure, the insulation layer may be formed on the entire top surface of the light reflection layer, and the light-absorption layer may be formed on the entire top surface of the insulation layer. The imaging element and the like configured in such a manner according to the second embodiment of the present disclosure will be called "the imaging element and the like according to the second-D embodiment" for the sake of convenience.

In the imaging element and the like according to the second embodiment of the present disclosure including the various preferred embodiments explained above, a drive circuit driving the photoelectric conversion unit may be formed on one surface of a substrate, the photoelectric conversion unit may be formed on the other surface of the substrate, a groove part with an insulating material or a light-shielding material embedded therein (a kind of element separation region) may be formed at an edge portion of the imaging element in such a manner as to range from the one surface to the other surface of the substrate and further extend up to the lower side of the wire grid polarizer. The imaging element and the like configured in such a manner according to the second embodiment of the present disclosure will be called "the imaging element and the like according to the second-B embodiment" for the sake of convenience.

In the imaging apparatus according to the second embodiment of the present disclosure, when one imaging element unit includes a plurality of imaging elements and the plurality of imaging elements is identical in a direction in which a line-and-space structure extends (first direction), the frame part may not be necessarily provided between the adjacent imaging elements in the imaging element unit.

The imaging element and the like according to the first-C embodiment and the imaging element and the like according to the second-C embodiment can be manufactured according to the following steps:

(A) after formation of the photoelectric conversion unit, providing on the photoelectric conversion unit the light reflection layer formative layer that is made from the first conductive material and is electrically connected to the substrate or the photoelectric conversion unit;

(B) providing an insulation layer formative layer on the light reflection layer formative layer, and providing on the insulation layer formative layer the light-absorption layer formative layer that is made from the second conductive material and is in at least partial contact with the light reflection layer formative layer; and (C) patterning the light-absorption layer formative layer, the insulation layer formative layer, and the light reflection layer formative layer to obtain the wire grid polarizer in which a plurality of line parts with belt-like, or strip-shaped, light reflection layer, insulation layer, and light-absorption layer is separated from each other and aligned in parallel with each other. That is, the plurality of line parts may be plural strip-shaped portions including the light reflection layer, insulation layer, and the light-absorption layer. The strip-shaped portions may be shaped generally like a rectangular parallelepiped, where face angles are substantially right angles so all faces are shaped like rectangles and all dihedral angles are substantially right angles.

At step (B), the light-absorption layer formative layer made from the second conductive material may be provided while the light reflection layer formative layer is set at a predetermined potential via the substrate or the photoelectric conversion unit, and at step (C), the light-absorption layer formative layer, the insulation layer formative layer, and the light reflection layer formative layer may be patterned while the light reflection layer formative layer is set at a predetermined potential via the substrate or the photoelectric conversion unit.

In addition, in the imaging apparatus including the imaging element and the like according to the first-C embodiment or the imaging element and the like according to the second-C embodiment, the region in which the substrate or the photoelectric conversion unit and the extension part of the light reflection layer (or the light reflection layer formative layer) are electrically connected may be positioned in the imaging region, or may be positioned in an optical black pixel region (OPB) provided at the outer periphery of the imaging region, or may be positioned in a peripheral region provided outside the imaging region. When being positioned in the imaging region or the optical black pixel region (OPB), the region in which the substrate or the photoelectric conversion unit and the extension part of the light reflection layer (or the light reflection layer formative layer) are electrically connected may be provided for each of the imaging elements, for two or more of the imaging elements, or for all the imaging elements. In addition, one or more regions may be provided for one imaging element. When being positioned in the peripheral region, one or more regions may be provided.

In the imaging apparatus including the imaging element and the like according to the first-C embodiment or the imaging element and the like according to the second-C embodiment, a light-shielding layer may be formed in a region between the imaging elements, and the extension part of the light reflection layer may be in contact with the region of the light-shielding layer. In this case, the length of the extension part of the light reflection layer in contact with the region of the light-shielding layer may be the same as the length of a photoelectric conversion region in which the imaging element substantially performs photoelectric conversion, or may be half of the length or the length of the photoelectric conversion region. By employing this configuration, it is possible to prevent the occurrence of color mixing from the adjacent imaging elements. In addition, the region where the light reflection layer formative layer and the light-absorption layer formative layer are in contact with each other is a region between the imaging elements that is at least at one of the four corners of the imaging element. The light-shielding layer may also be formed in the peripheral region so that the extension part of the light reflection layer is in contact with the region in the light-shielding layer. The length of the extension part of the light reflection layer in contact with the region of the light-shielding layer may be of an arbitrary length.

In the peripheral region, the formation of the wire grid polarizer is not necessary. The peripheral region is preferably occupied by the same structure as that of the frame part. The frame part or the peripheral region may be provided with a line-and-space pattern as in the wire grid polarizer because the frame part or the peripheral region does not serve as a wire grid polarizer. That is, the formation pitch $P_0$ of the wire grid may be sufficiently larger than the effective wavelength of the incident electromagnetic wave.

In the imaging elements and the like according to the first and second embodiments of the present disclosure including the preferred embodiments and configurations explained above (hereinafter, they will be also collectively called simply "the imaging elements and the like of the present disclosure"), the direction in which the belt-like, or strip-shaped, light reflection layer extends (first direction) matches with the polarization orientation for extinction, and the repetition direction of the belt-like, or strip-shaped, light reflection layer matches with the polarization orientation for transmission. That is, the light reflection layer serves as a polarizing device to, out of the light incident on the wire grid polarizer, attenuate a polarized wave (any one of TE wave/S wave and TM wave/P wave) having an electric field component in a direction parallel to the extension direction of the light reflection layer, and transmit a polarized wave (any one of TE wave/S wave and TM wave/P wave) having an electric field component in a direction orthogonal to the extension direction of the light reflection layer (the repetition direction of the belt-like, or strip-shaped, light reflection layer). That is, the extension direction of the light reflection layer constitutes a light-absorption axis of the wire grid polarizer, and the direction orthogonal to the extension direction of the light reflection layer (second direction) constitutes a light transmission axis of the wire grid polarizer.

In the imaging elements and the like of the present disclosure, the length of the line-and-space structure along the first direction may be equal to the length along the first direction of the photoelectric conversion region in which the imaging element substantially performs photoelectric conversion, or may be an integral multiple of the length of the imaging element along the first direction.

In the imaging elements and the like of the present disclosure, as for the angle formed by the array direction of the plurality of imaging elements and the first direction, the imaging elements having an angle of 0 degrees and the imaging elements having an angle of 90 degrees may be combined, or the imaging elements having an angle of 0 degrees, the imaging elements having an angle of 45 degrees, the imaging elements having an angle of 90 degrees, and the imaging elements having an angle of 135 degrees may be combined, for example.

In the imaging elements and the like of the present disclosure, the wire grid polarizer may be arranged on an on-chip lens (OCL), or the on-chip lens (OCL) may be arranged on the wire grid polarizer. The former imaging element will be called "imaging element-A of the present disclosure," and the latter imaging element will be called "imaging element-B of the present disclosure," for the sake of convenience.

In the imaging element-A of the present disclosure, for example, a flattening layer made from a transparent resin (for example, an acrylic resin) and a foundation insulation layer made from an inorganic material such as a silicon oxide film serving as a foundation in the process of manufacture of the wire grid polarizer may be formed from the on-chip lens side between the on-chip lens (positioned on the lower side) and the wire grid polarizer (positioned on the upper side). Further, in the imaging element-A of the present disclosure including these preferred configurations, a wavelength selection layer (specifically, a known color filter layer, for example) may be arranged on the lower side of the on-chip lens.

In addition, in the imaging element-B of the present disclosure, the wavelength selection layer (specifically, a known color filter layer, for example) may be arranged between the wire grid polarizer (positioned on the lower side) and the on-chip lens (positioned on the upper side). By employing this configuration, it is possible to optimize each wire grid polarizer independently in the wavelength band of transmitted light in the wire grid polarizer, and realize a lower reflectance across the entire visible light region. A flattening layer may be formed between the wire grid polarizer and the wavelength selection layer, and a foundation insulation layer made from an inorganic material such as a silicon oxide film serving as foundation in the process of manufacture of the wire grid polarizer may be formed under the wire grid polarizer.

The color filter layer may be a filter layer that transmits light with specific wavelengths of one or more of red, green, blue, cyan, magenta, yellow, and the like. The color filter layer may be made from an organic material-based color filter layer including organic compounds such as pigments or dyes, or may be made from a thin film of an inorganic material such as a photonic crystal, a wavelength selection element with application of plasmon (a color filter layer having a conductive grid structure in which a grid-like hole structure is provided on a conductive thin film as described in JP 2008-177191A, for example), or amorphous silicon.

In addition, in the imaging elements and the like of the present disclosure, a light-shielding layer made from one or more of chrome (Cr), copper (Cu), aluminum (Al), and tungsten (W), for example, may be provided in the region between the adjacent imaging elements, for example. Accordingly, it is possible to prevent leakage of light to the adjacent imaging elements (polarization crosstalk) in a more effective manner. Further, various kinds of wiring (wiring layer) made from one or more of aluminum (Al) and copper (Cu) are formed at the photoelectric conversion unit to drive the imaging element.

The substrate may be a silicon semiconductor substrate or a compound semiconductor substrate such as an InGaAs substrate.

In the imaging element-A of the present disclosure, the photoelectric conversion unit includes the photoelectric conversion region for generating electric current on the basis of the incident light, the on-chip lens, the flattening layer, the foundation insulation layer, the light-shielding layer, the color filter layer, the wiring (wiring layer), and various inter-layer insulation layers. In addition, in the imaging element-B of the present disclosure, the photoelectric conversion unit includes the photoelectric conversion region for generating electric current on the basis of the incident light, the foundation insulation layer, the light-shielding layer, the wiring (wiring layer), and various inter-layer insulation layers. The photoelectric conversion unit to which the extension part of the light reflection layer and the light reflection layer formative layer are electrically connected is a light-shielding layer or wiring (wiring layer), for example. A high-concentration impurity region, a metallic layer, an alloy layer, a wiring layer, and the like may be formed at a portion of the substrate to which the extension part of the light reflection layer and the light reflection layer formative layer are electrically connected, for example.

In the imaging elements and the like of the present disclosure, the light reflection layer may be made from one or more of a metallic material, an alloy material, and a semiconductor material. The light-absorption layer may be made from one or more of a metallic material, an alloy material, and a semiconductor material.

The inorganic materials for the light reflection layer (light reflection layer formative layer) may be metallic materials such as aluminum (Al), silver (Ag), gold (Au), copper (Cu), platinum (Pt), molybdenum (Mo), chrome (Cr), titanium (Ti), nickel (Ni), tungsten (W), iron (Fe), silicon (Si), germanium (Ge), and tellurium (Te), and alloy materials and semiconductor materials including the foregoing metals.

The materials for the light-absorption layer (light-absorption layer formative layer) may be metallic materials, alloy materials, or semiconductor materials with an extinction coefficient k of not zero, that is, with a light-absorption effect. Specifically, the materials may be aluminum (Al), silver (Ag), gold (Au), copper (Cu), molybdenum (Mo), chrome (Cr), titanium (Ti), nickel (Ni), tungsten (W), iron (Fe), silicon (Si), germanium (Ge), tellurium (Te), and tin (Sn), and alloy materials and semiconductor materials including the foregoing metals. In addition, the materials may include one or more of silicide-based materials such as $FeSi_2$ (in particular, $\beta\text{-}FeSi_2$), $MgSi_2$, $NiSi_2$, $BaSi_2$, $CrSi_2$, and $CoSi_2$. Especially, using a semiconductor material for the light-absorption layer (light-absorption layer formative layer) including aluminum, its alloy, or $\beta\text{-}FeSi_2$, germanium, and tellurium, it is possible to obtain a high contrast (high extinction ratio) in the visible light region. To impart polarization properties to a wavelength band other than the visible light region, for example, the infrared region, the materials for the light-absorption layer (light-absorption layer formative layer) include one or more of silver (Ag), copper (Cu), gold (Au), and the like. This is because resonant wavelengths of these metals are in the vicinity of the infrared region.

The light reflection layer formative layer and the light-absorption layer formative layer can be formed by any of known methods such as various chemical vapor deposition methods (CVD method), application method, various physical vapor deposition methods (PVD methods) including sputtering and vacuum evaporation, sol-gel method, plating method, MOCVD method, and MBE method. In addition, the method for patterning the light reflection layer formative layer and the light-absorption layer formative layer may be a combination of lithography technique and etching technique (for example, an anisotropic dry etching technique using carbon tetrafluoride gas, sulfur hexafluoride gas, trifluoro methane gas, or xenon difluoride gas, or physical etching technique), or a liftoff technique, a self-aligned double patterning technique using a side wall as a mask. In addition, the lithography technique may be any of photolithography techniques (lithography techniques using g-line and i-line of a high-pressure mercury lamp, KrF excimer laser, ArF excimer laser, or EUV as a light source, and immersion lithography techniques, electron beam lithography technique, X-ray lithography). Alternatively, the light reflection layer and the light-absorption layer may be formed by a microfabrication technique using extremely short-time pulse laser such as femtosecond laser, or a nano-print method.

The materials for the insulation layer (the insulation layer formative layer) and the inter-layer insulation layers may be insulating materials that are transparent to the incident light and have no light-absorption property. Specifically, the materials may be $SiO_x$-based materials (constituting a silicon oxide film) such as $SiO_2$, NSG (non-doped silicate glass), BPSG (boron-phosphorus silicate glass), PSG, BSG, PbSG, AsSG, SbSG, and SOG (spin-on-glass), SiN, SiON, SiOC, SiOF, SiCN, low-dielectric constant insulating materials (for example, fluorocarbon, cycloperfluorocarbon polymer, benzocyclobutene, annular fluorine resin, polytetrafluoroethylene, amorphous tetrafluoroethylene, polyarylether, fluorinated aryl ether, fluorinated polyimide, organic SOG, parylene, fluoride fullerene, and amorphous carbon), polyimide-based resin, fluorine-based resin, Silk (a coating-type low-dielectric inter-layer dielectric film material under a trademark of The Dow Chemical Co.), and Flare (a polyallylether (PAE)-based material under a trademark of Honeywell Electronic Materials Co.). These materials can be used singly or in combination as appropriate. The insulation layer formative layer can be formed by any of known methods such as various CVD methods, application methods, various PVD methods including sputtering and vacuum evaporation, various printing methods such as screen printing method, and sol-gel method. The insulation layer is formed for the purpose of serving as a foundation layer for the light-absorption layer and adjusting the phases of the polarized light reflected on the light-absorption layer and the polarized light passing through the light-absorption layer and reflected on the light reflection layer, thereby to improve the extinction ratio and the transmittance due to interference effect and reduce the reflectance. Therefore, the insulation layer has desirably a thickness with which the optical phase is shifted by one half wavelength (when the light makes a round trip and is reflected by the reflection layer). However, the light-absorption layer absorbs the reflected light due to its light-absorption effect. Therefore, it is possible to improve the extinction ratio even though the thickness of the insulation layer is not optimized as described above. Accordingly, the thickness of the insulation layer can be based on the balance between the desired polarization property and the actual production process. For example, the thickness may be $1\times10^{-9}$ m to $1\times10^{-7}$ m, more preferably, $1\times10^{-8}$ m to $8\times10^{-8}$ m. In addition, the refractive index of the insulation layer is preferably larger than 1.0 and equal to or less than 2.5; however, the refractive index of the insulation layer may be less than 1.0 or greater than 2.5.

In the imaging apparatus according to the first and second embodiments of the present disclosure, one imaging element unit (one pixel) can be formed from a plurality of imaging elements (sub pixels). Then, for example, each sub pixel includes one imaging element. The relationship between the pixel and the sub pixels will be described later.

In the imaging elements and the like of the present disclosure, light enters from the light-absorption layer. Then, the wire grid polarizer utilizes four actions; that is, transmission, reflection, interference of light, and selective light-absorption of polarized wave due to optical anisotropy, to attenuate a polarized wave having an electric field component parallel to the first direction (one of TE wave/S wave and TM wave/P wave) and transmit a polarized wave having an electric field component parallel to the second direction (the other of TE wave/S wave and TM wave/P wave). That is, one polarized wave (for example, TE wave) is attenuated by the action of selective light-absorption of polarized wave due to optical anisotropy of the light-absorption layer. The belt-like, or strip-shaped, light reflection layer serves as a polarizing device and reflects the one polarized wave (for example, TE wave) having passed through the light-absorption layer and the insulation layer. By configuring the insulation layer such that the phase of the one polarized wave (for example, TE wave) having passed through the light-absorption layer and reflected on the light reflection layer is shifted by one half wavelength, the one polarized wave (for example, TE wave) having reflected on the light reflection layer is canceled and attenuated due to interference with the one polarized wave (for example, TE wave) having reflected on the light-absorption layer. In this manner, the one polarized wave (for example, TE wave) can be selectively attenuated. However, as described above, it is possible to improve the contrast even though the thickness of the insulation layer is not optimized. Therefore, as described above, the thickness of the insulation layer can be based on balancing the desired polarization property and the actual production process.

All the imaging elements constituting the imaging apparatus of the present disclosure may include wire grid polarizers, or some of the imaging elements may include wire grid polarizers. The imaging element unit formed from a plurality of imaging elements may have a Bayer array. One imaging element unit (one pixel) may be composed of four imaging elements. However, the array of the imaging element unit is not limited to the Bayer array but may be any other array such as an inter-line array, a G stripe RB checkered array, a G stripe RB complete checkered array, a checkered complementary color array, a stripe array, an oblique stripe array, a primary color difference array, a field color difference sequential array, a frame color difference sequential array, a MOS-type array, an improved MOS-type array, a frame interleave array, a field interleave array, and combinations thereof. In the case of the Bayer array, for example, the color filter layers of red, green, and blue are arranged in three of 2×2 sub-pixel regions, and the color filter layer is not arranged in the remaining one sub region in which the color filter layer of green is to be arranged but the wire grid polarizer is arranged in the remaining one sub-pixel region. Alternatively, in the case of the Bayer array, the color filter layers of red, green, and blue may be arranged in the three of the 2×2 sub-pixel regions, and the color filter layer of green and the wire grid polarizer may be arranged in the remaining one sub-pixel region. In addition, no filters may be necessary when no color separation or spectroscopy is intended or the imaging element is sensitive to specific wavelengths. Instead of the color filter layer, a transparent resin layer may be formed in the sub-pixel region without the color filter layer to secure flatness relative to the sub-pixel regions with the color filter layers. That is, the imaging elements may include a combination of a red imaging element sensitive to red color, a green imaging element sensitive to green color, and a blue imaging element sensitive to blue color, or may include a combination of the foregoing three imaging elements and an infrared imaging element sensitive to infrared rays. The imaging apparatus may be provided as an imaging apparatus for obtaining a single-color image or as an imaging apparatus for obtaining a combination of single-colored images and images based on infrared rays.

The imaging elements and the like of the present disclosure may be CCD elements, CMOS image sensors, contact image sensors (CIS), or charge modulation device (CMD) signal-amplified image sensors. The imaging elements may also be front side-illuminated imaging elements or back side-illuminated imaging elements. The imaging apparatus may constitute a digital still camera, a video camera, a camcorder, a surveillance camera, an in-vehicle camera, a smartphone camera, a user interface camera for games, and a biometric camera, for example. In addition, the imaging apparatus may be provided as an imaging apparatus capable of general imaging and si-multaneous acquisition of polarization information. Further, the imaging apparatus may be provided as an imaging apparatus taking three-dimensional images.

Example 1

Figure 2:
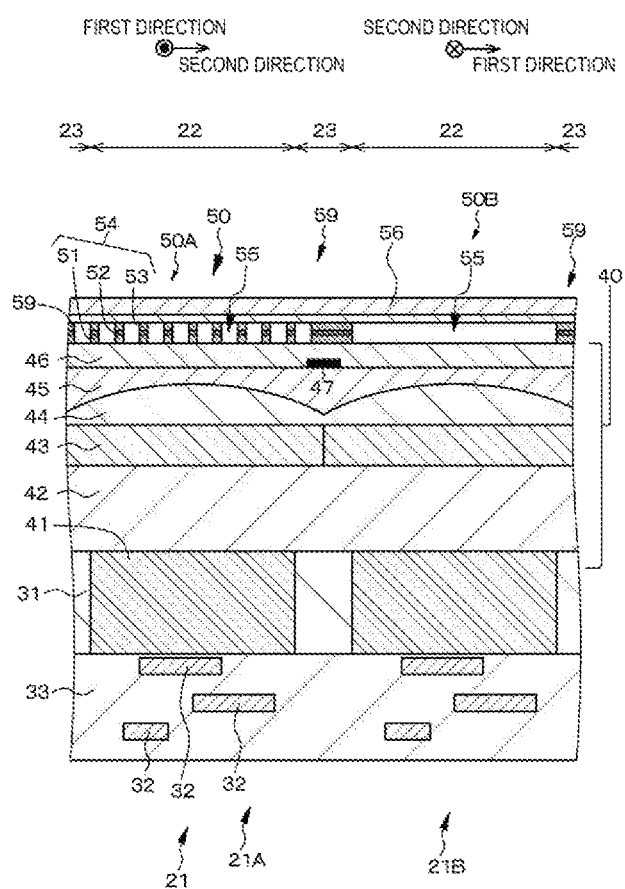
FIG. 2 is a schematic partial end surface view of the imaging elements in the imaging apparatus of the example 1.
Figure 3:
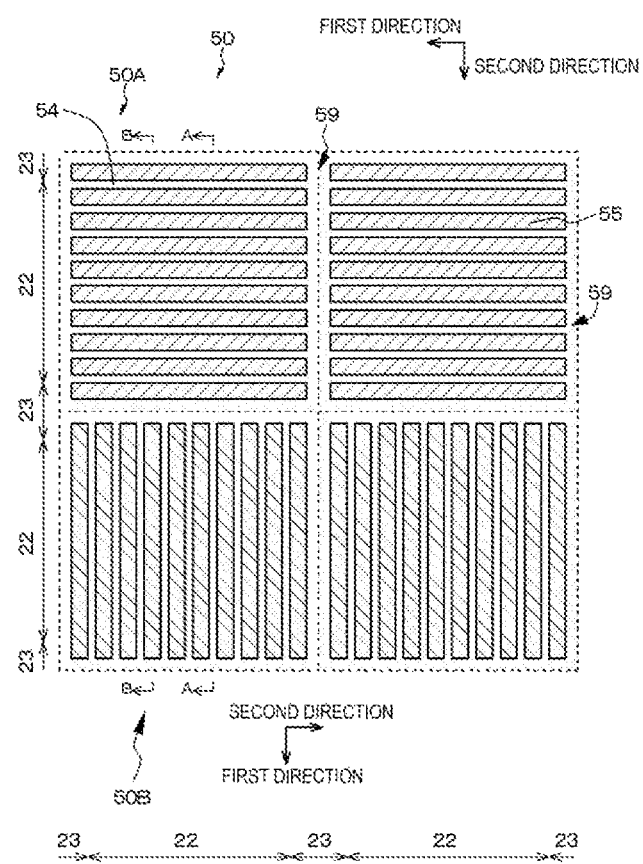
FIG. 3 is a partial plane view of the imaging elements in the imaging apparatus of the example 1.
Figure 4:
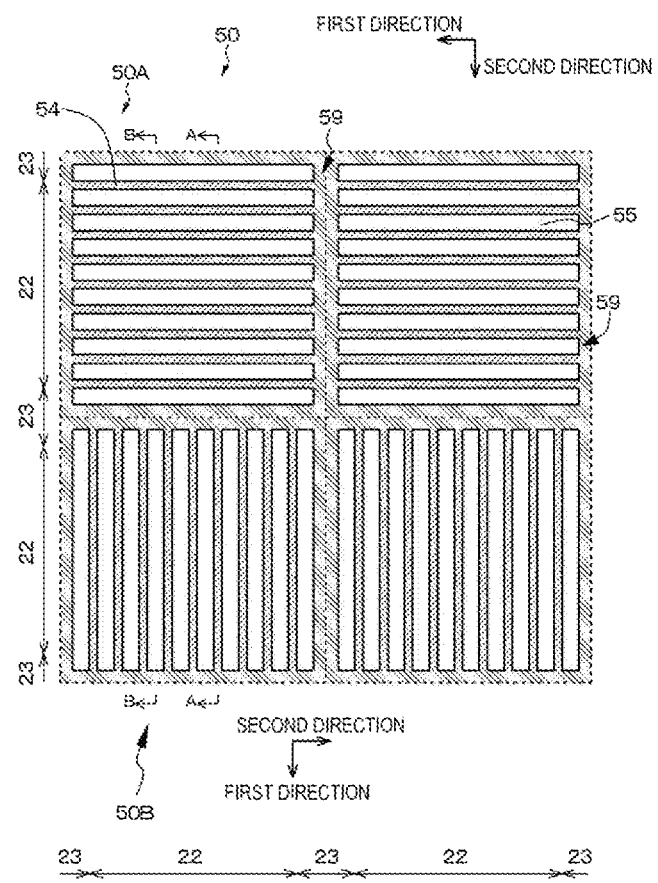
FIG. 4 is a partial plane view of the imaging elements in the imaging apparatus of the example 1.
Figure 5:
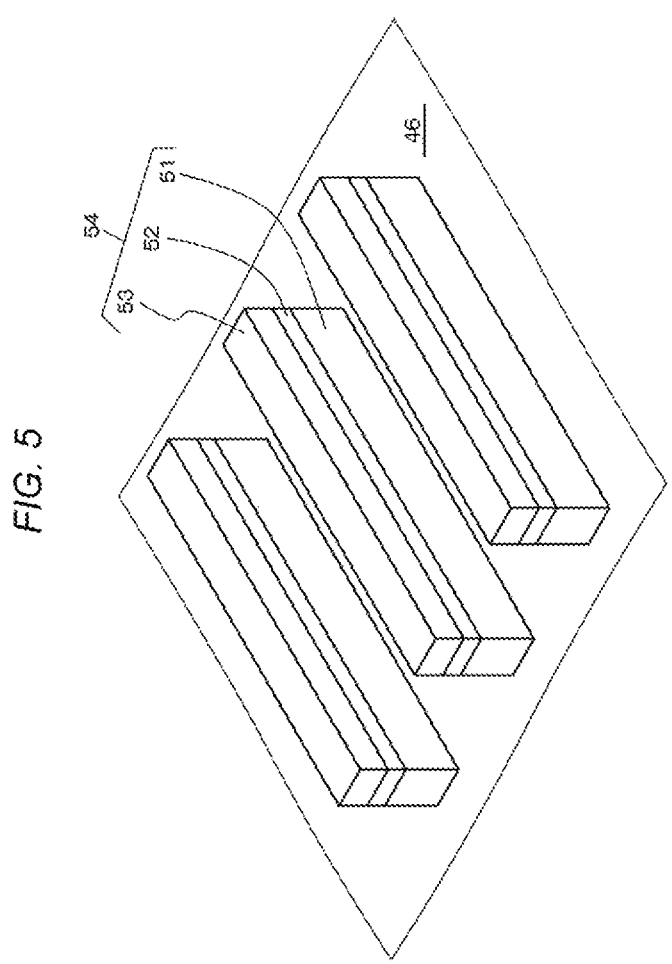
FIG. 5 is a schematic perspective view of a wire grid polarizer constituting the imaging element in the imaging apparatus of the example 1.
Figure 6:
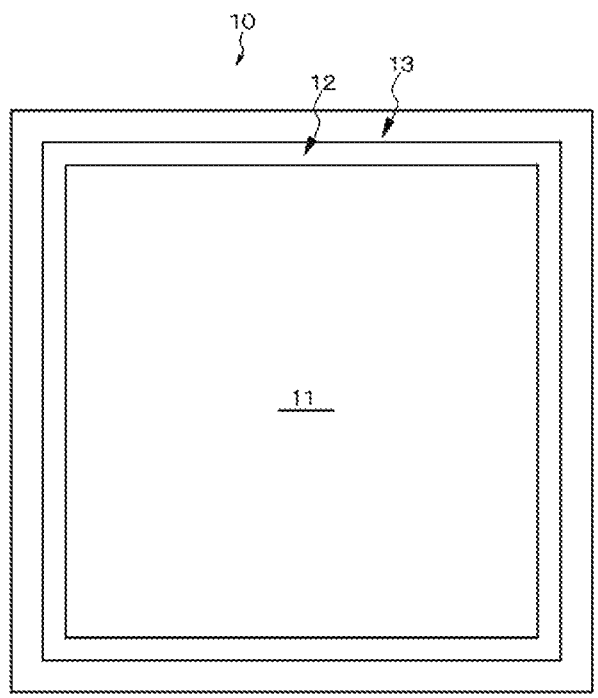
FIG. 6 is a schematic plane view of the imaging apparatus illustrating an imaging region and the like in the imaging apparatus of the example 1.

Example 1 relates to the imaging elements and the imaging apparatuses according to the first and second embodiments of the present disclosure, more specifically, to the imaging element-A of the present disclosure, the imaging element and the like according to the first-A embodiment, and the imaging element and the like according to the first-D embodiment. That is, in these imaging elements, the wire grid polarizer is arranged on the upper side of the on-chip lens (OCL). The imaging apparatuses have back side-illuminated imaging elements. FIGS. 1 and 2 are schematic partial end surface views of the imaging elements constituting the imaging apparatus of the example 1. FIGS. 3 and 4 are schematic partial plane views of the imaging elements in the imaging apparatus of the example 1. FIG. 5 is a schematic perspective view of the wire grid polarizer constituting the imaging element in the imaging apparatus of the example 1. FIG. 6 is a schematic plane view of the imaging apparatus illustrating an imaging region and the like in the imaging apparatus of the example 1. FIGS. 1 and 2 illustrate two imaging elements, and FIGS. 3 and 4 illustrate four imaging elements. In addition, FIG. 1 is a schematic partial end surface view along arrows A-A in FIGS. 3 and 4, and FIG. 2 is a schematic partial end surface view along arrows B-B in FIGS. 3 and 4. FIGS. 1 and 2 are a schematic partial end surface view of the imaging elements along the direction of extension of a line-and-space structure (first direction) in the wire grid polarizer and a schematic partial end surface view of the imaging elements along the second direction. Further, in FIGS. 3 and 4, the boundaries between the imaging elements are shown by dotted lines. In FIG. 3, the gaps (space parts) between the line parts are marked with oblique lines, and in FIG. 4, the line parts and the frame parts in the line-and-space structure are marked with different oblique lines. The space parts 55 may be disposed between the protective layer 56 and the insulation layer 46.

An imaging element 21 of the example 1 includes a photoelectric conversion unit 40 formed on a substrate 31 and a wire grid polarizer 50 that is disposed on the light-incident side of the photoelectric conversion unit 40 and has a line-and-space structure. The line parts are shown with reference number 54, and the space parts are shown with reference number 55.

Then, the imaging element 21 of the example 1 will be explained as the imaging element according to the first embodiment of the present disclosure. The imaging element 21 of the example 1 includes a protective layer 56 formed on the wire grid polarizer 50 and the space parts 55 as air gaps in the wire grid polarizer 50. That is, some or all of the space parts 55 are filled with the air, where the air includes one or more elements that is in at least one of a gaseous or vapor state. In the example 1, specifically, all the space parts 55 are filled with the air. The space parts 55 may be disposed between the protective layer 56 and the insulation layer 46.

In addition, the imaging element 21 of the example 1 will be explained as the imaging element according to the second embodiment or the imaging element and the like according to the first-A embodiment of the present disclosure. The imaging element 21 of the example 1 includes a frame part 59 surrounding the wire grid polarizer. The frame part 59 and the line parts 54 of the wire grid polarizer 50 are coupled together. The frame part 59 is structured in the same manner as the line parts 54 of the wire grid polarizer 50.

In the imaging element 21 of the example 1, a second protective layer 57 is further formed between the wire grid polarizer 50 and the protective layer 56. In some embodiments, the space parts 55 may be disposed between the insulation layer 46 and the second protective layer 57. When the refractive index of the material for the protective layer 56 is designated as $n_1$ and the refractive index of the material for the second protective layer 57 is designated as $n_2$, the following relationship is satisfied:

$$n_1 > n_2.$$

In this example, the protective layer 56 is made from SiN ($n_1=2.0$) and the second protective layer 57 is made from SiO$_2$ ($n_2=1.46$). In the drawing, the bottom surface of the second protective layer 57 (the surface opposed to the photoelectric conversion unit 40) is in the flat state. However, the bottom surface of the second protective layer 57 may be convex toward the space parts 55, or may be concave toward the protective layer 56, or may be recessed in a wedge shape.

The line parts 54 of the wire grid polarizer 50 have a layered structure in which a light reflection layer 51 made from a first conductive material (specifically, aluminum (Al) for example), an insulation layer 52 made from SiO$_2$ for example, and a light-absorption layer 53 made from a second conductive material (specifically, tungsten (W) for example) are layered from the photoelectric conversion unit side. The insulation layer 52 is formed on the entire top surface of the light reflection layer 51, and the light-absorption layer 53 is formed on the entire top surface of the insulation layer 52. A foundation film having a layered structure of Ti, TiN, or Ti/TiN is formed between the photoelectric conversion unit 40 and the light reflection layer 51, although the foundation film is not illustrated in the drawing.

The imaging apparatus of the example 1 has a plurality of imaging elements 21 of the example 1 in an imaging region 11, and includes two or more kinds of wire grid polarizers 50 different in the polarization orientation, for example. Accordingly, transmission axes of wire grid polarizers 50A and 50B are orthogonal in adjacent imaging elements 21A and 21B. The imaging apparatus of the example 1 may constitute one or more of a digital still camera, a video camera, a camcorder, a surveillance camera, an in-vehicle camera, a smartphone camera, a user interface camera for games, and a biometric camera, for example. In addition, in the example 1, an on-chip lens 44 may be arranged on the upper side of a photoelectric conversion region 41, and the wire grid polarizer 50 is provided at the upper side of the on-chip lens 44. Reference number 22 represents regions occupied by the imaging elements 21, and reference number 23 represents regions between the imaging elements 21.

Specifically, the imaging element 21 of the example 1 is formed by layering the photoelectric conversion region 41 on the substrate 31 as a silicon semiconductor substrate, and layering on the photoelectric conversion region 41 a first flattening film 42, a wavelength selection layer (color filter layer 43), the on-chip lens 44, a flattening layer (called second flattening film 45), a foundation insulation layer 46, and the wire grid polarizer 50, for example. The first flattening film 42 and the foundation insulation layer 46 are made from SiO$_2$ for example, and the flattening layer (second flattening film 45) is made from an acrylic resin for example. The photoelectric conversion region 41 is formed from a CCD element, a CMOS image sensor, and the like. A light-shielding layer (black matrix layer) 47 made from tungsten (W) and the like is provided in a region between the adjacent on-chip lenses 44 (more specifically, the foundation insulation layer 46 between the on-chip lenses 44), for example. The light-shielding layer 47 is preferably disposed in the foundation insulation layer 46 as an insulating material for avoiding mutual interference between the free electrons in the light reflection layer 51 and the light-shielding layer 47 made from metallic materials, for example. The light-shielding layer 47 may be grounded, for example.

In the imaging elements of the example 1, the photoelectric conversion unit 40 is formed by the photoelectric conversion region 41, the first flattening film 42, the wavelength selection layer (color filter layer 43), the on-chip lens 44, the flattening layer (second flattening film 45), the foundation insulation layer 46, and the light-shielding layer 47.

In addition, in the imaging apparatus of the example 1, the light reflection layer 51, the insulation layer 52, and the light-absorption layer 53 are common among the imaging elements. An optical black pixel region (OPB) 12 and a peripheral region 13 are occupied by the same structure as the frame part 59 formed from the light reflection layer 51, the insulation layer 52, and the light-absorption layer 53.

Figure 21:
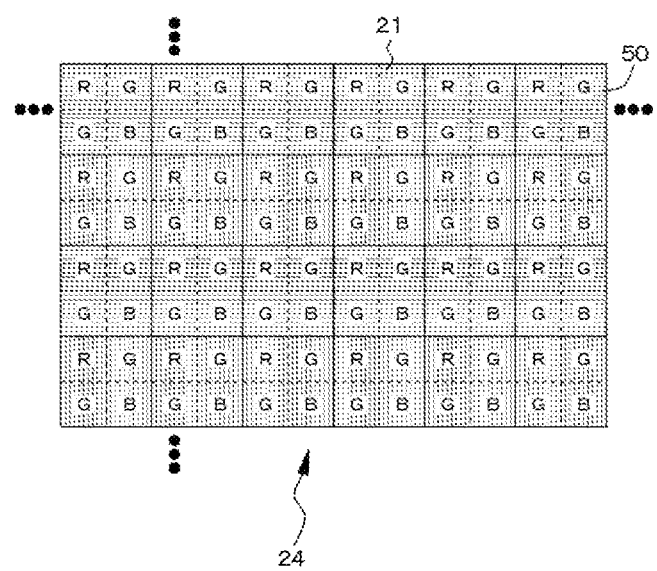
FIG. 21 is a conceptual view of an imaging element unit having a Bayer array in the imaging apparatus of the example 1.
Figure 22:
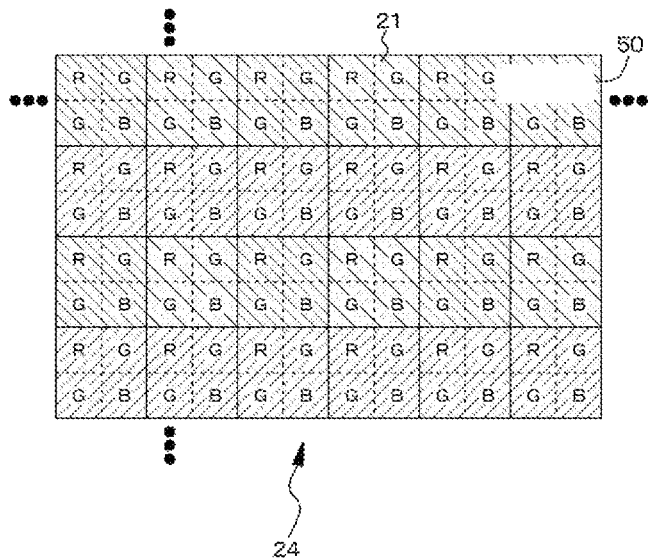
FIG. 22 is a conceptual view of a modification example of the imaging element unit having the Bayer array in the imaging apparatuses of the examples 1 to 4.

In the example 1, the imaging element unit (pixel) 24 formed from a plurality of imaging elements has the Bayer array and includes four imaging elements. FIG. 21 is a conceptual view of the imaging element units 24 having the Bayer array. That is, one imaging element (one pixel) 24 includes one sub pixel receiving red light (red imaging element R in FIG. 21), one sub pixel receiving blue light (blue imaging element B in FIG. 21), and two sub pixels receiving green light (green imaging elements G in FIG. 21). The imaging element units 24 are arrayed in a two-dimensional matrix in row and column directions. In one imaging element unit, the first directions of all the wire grid polarizers 50 are identical. In addition, in the imaging element units arrayed in the row direction, the first directions of all the wire grid polarizers 50 are identical. Meanwhile, the imaging element units in which the first directions of the wire grid polarizers 50 are parallel to the row direction and the imaging element units in which the first directions of the wire grid polarizers 50 are parallel to the column direction are alternately arranged. In FIG. 21 or FIGS. 22 to 35 described later, the wire grid polarizers are illustrated as being hatched lines.

Then, the wire grid polarizer 50 is formed by layering the light reflection layer 51, the insulation layer 52, and the light-absorption layer 53 from the photoelectric conversion unit 40 side as described above. That is, the line parts 54 include the light reflection layer 51, the insulation layer 52, and the light-absorption layer 53. The insulation layer 52 is formed on the entire top surface of the light reflection layer 51, and the light-absorption layer 53 is formed on the entire top surface of the insulation layer 52. Specifically, the light reflection layer 51 is made from aluminum (Al), for example, with a thickness of 150 nm, the insulation layer 52 is made from $SiO_2$, for example, with a thickness of 25 or 50 nm, and the light-absorption layer 53 is made from tungsten (W), for example, with a thickness of 25 nm. The direction of extension of the belt-like, or strip-shaped, light reflection layer 51 (first direction) is equal to the polarization orientation for extinction. The direction of repetition of the belt-like, or strip-shaped, light reflection layer 51 (second direction orthogonal to the first direction) is equal to the polarization orientation for transmission. That is, the light reflection layer 51 has the function of a polarizing device. Out of the light incident on the wire grid polarizer 50, the light reflection layer 51 attenuates a polarized wave having an electric field component in the direction parallel to the direction of extension of the light reflection layer 51 (first direction), and transmits a polarized wave having an electric field component in the direction orthogonal to the direction of extension of the light reflection layer 51 (second direction). The first direction is parallel to the light-absorption axis of the wire grid polarizer 50, and the second direction is parallel to the light transmission axis of the wire grid polarizer 50.

In the example 1, the length of the line part 54 in the first direction is identical to the length along the first direction of the photoelectric conversion region 41 along the first direction. In addition, in the example illustrated in the drawing, as for the angle formed by the array direction of the plurality of imaging elements and the first direction (the direction of extension of the belt-like, or strip-shaped, light reflection layer 51), the imaging elements having an angle of 0 degrees and the imaging elements having an angle of 90 degrees are combined. Alternatively, the imaging elements having an angle of 0 degrees, the imaging elements having an angle of 45 degrees, the imaging elements having an angle of 90 degrees, and the imaging elements having an angle of 135 degrees may be combined, for example.

A method for manufacturing the imaging element and the imaging apparatus of the example 1 will be explained below with reference to FIGS. 7A to 7D as the schematic partial cross-sectional views of the substrate and the like.

(Step-100)

First, various drive circuits and wiring (wiring layer) for driving the imaging element are formed by a known method on one surface of the substrate 31 as a silicon semiconductor substrate. The drive circuits and wiring (wiring layer) are collectively shown with reference number 32. Then, the thickness of the substrate 31 is set to a desired thickness by applying polishing or the like to the other surface of the substrate 31. Reference number 33 represents an inter-layer insulation film formed on the one surface of the substrate 31.

(Step-110)

Next, the photoelectric conversion unit 40 is formed on the substrate 31 by a known method. Specifically, the photoelectric conversion region 41 is formed on the other surface of the substrate 31, and then a connection portion for electrically connecting the photoelectric conversion region 41 and the drive circuits and wiring (wiring layer) 32 is formed thereon (not illustrated). After that, the first flattening film 42, the wavelength selection layer (color filter layer 43), the on-chip lens 44, the flattening layer (second flattening film 45), the light-shielding layer 47, and the foundation insulation layer 46 are formed on the photoelectric conversion region 41 by a known method. Accordingly, the photoelectric conversion unit 40 can be formed. As described above, the photoelectric conversion unit 40 is formed by the photoelectric conversion region 41, the first flattening film 42, the wavelength selection layer (color filter layer 43), the on-chip lens 44, the flattening layer (second flattening film 45), the light-shielding layer 47, and the foundation insulation layer 46.

(Step-120)

Figure 7A:
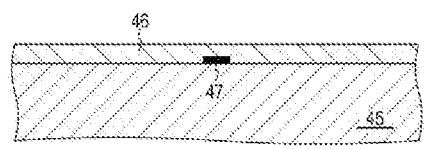
FIGS. 7A to 7D are schematic partial end surface view of a substrate and the like for describing a manufacturing method of the imaging element and the imaging apparatus of the example 1.
Figure 7B:
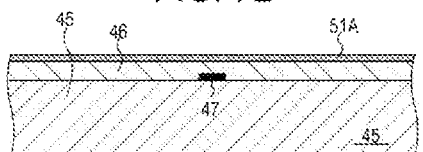
Figure 7C:
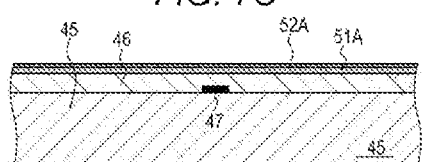
Figure 7D:
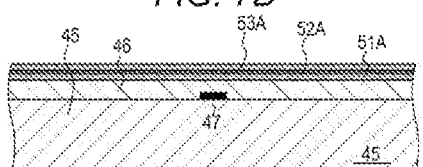

Next, a foundation film with a layered structure of Ti, TiN, or Ti/TiN (not illustrated) and a light reflection layer formative layer 51A made from the first conductive material (specifically, aluminum) are provided on the photoelectric conversion unit 40 (specifically, the foundation insulation layer 46) by a vacuum evaporation method (see FIGS. 7A and 7B).

(Step-130)

After that, an insulation layer formative layer 52A is provided on the light reflection layer formative layer 51A, and a light-absorption layer formative layer 53A made from the second conductive material is provided on the insulation layer formative layer 52A. Specifically, the insulation layer formative layer 52A made from $SiO_2$ is formed on the light reflection layer formative layer 51A by a CVD method (see FIG. 7C). After that, a light-absorption layer formative layer 53A made from tungsten (W) is formed on the insulation layer formative layer 52A by a sputtering method. Accordingly, the structure illustrated in FIG. 7D can be obtained.

(Step-140)

After that, the light-absorption layer formative layer 53A, the insulation layer formative layer 52A, the light reflection layer formative layer 51A, and the foundation film are patterned by a lithography technique and a dry etching technique, thereby to obtain the wire grid polarizer 50 having a line-and-space structure in which a plurality of line parts (layered structures) 54 of the belt-like, or strip-shaped, light reflection layer 51, insulation layer 52, and light-absorption layer 53 is arranged in parallel with spacing therebetween. That is, the strip-shaped portions may be shaped generally like a rectangular parallelepiped, where face angles are substantially right angles so all faces are shaped like rectangles and all dihedral angles are substantially right angles. In addition, the regions 23 between the imaging elements are occupied by the frame part 59 formed from the light reflection layer 51, the insulation layer 52, and the light-absorption layer 53, and the optical black pixel region (OPB) 12 and the peripheral region 13 are occupied by the layered structure configured in the same manner as the frame part 59.

(Step-150)

After that, the second protective layer 57 made from $SiO_2$ with an average thickness of 0.01 to 10 μm is formed on the entire surface by a CVD method. The upper side of the space parts 55 between the line parts 54 is blocked with the second protective layer 57. Then, the protective layer 56 made from SiN with an average thickness of 0.1 to 10 μm is formed on the second protective layer 57 by a CVD method. By making the protective layer 56 from SiN, it is possible to obtain the imaging element with high reliability. However, SiN has a relatively high permittivity, and the second protective layer 57 made from $SiO_2$ is formed to decrease the average refractive index $n_0$.

(Step-160)

After that, the imaging apparatus is assembled by known processes of forming electrode pads (not illustrated), dicing and separating chips, and then packaging.

In the imaging elements or the imaging apparatus of the example 1, the space parts in the wire grid polarizer are air gaps (specifically, filled with the air that includes one or more elements that is in at least one of a gaseous or vapor state). This makes it possible to decrease the value of the average refractive index $n_0$, and improve the transmittance factor and the extinction ratio of the wire grid polarizer. In addition, the value of the formation pitch $P_0$ can be increased to improve the manufacturing yield of the wire grid polarizer. Further, the protective layer is formed on the wire grid polarizer, thereby making it possible to provide the imaging elements and the imaging apparatus with high reliability. The frame part and the line parts of the wire grid polarizer are coupled together, and the frame part is structured in the same manner as the line parts of the wire grid polarizer. Accordingly, it is possible to form the homogenous and uniform wire grid polarizers in a stable manner. Therefore, it is possible to provide the imaging element and the imaging apparatus with high reliability, not causing the problem that portions of the outer periphery of the wire grid polarizer corresponding to the four corners of the imaging element frequently separate from the photoelectric conversion unit, the problem that a structural difference occurs between the outer periphery of the wire grid polarizer and the central part of the wire grid polarizer to reduce the performance of the wire grid polarizer, and the problem that the light incident on the outer periphery of the wire grid polarizer is likely to leak to the adjacent imaging element with a different direction of polarization.

In addition, the wire grid polarizer is integrally formed in an on-chip manner on the upper side of the photoelectric conversion region, thereby making the imaging elements thinner. As a result, it is possible to minimize mixture of polarized light into the adjacent imaging elements (polarized crosstalk). The wire grid polarizer may be an absorption-type wire grid polarizer having an absorption layer with low reflectance. This reduces an influence of stray light, flare, and the like on video images.

In addition, the imaging apparatus includes the wire grid polarizers, and is capable of acquiring polarization information at the same time as performing general imaging. That is, the imaging apparatus can be provided with the polarization separation function to subject the polarization information of the incident light to spatial polarization separation. Specifically, the light intensity, the polarization component intensity, and the polarization direction can be obtained by each of the imaging elements. Accordingly, for example, the image data can be processed on the basis of the polarization information after the imaging. For example, desired processing can be applied to a portion of an image including the sky or a windowpane, a portion of an image including a water surface, or the like, thereby to enhance or reduce the polarization component or separate the polarization component and the non-polarization component, and improve the contrast of the image and delete unnecessary information. Specifically, the foregoing processes can be performed by specifying the imaging mode at the time of imaging with the use of the imaging apparatus, for example. Further, the imaging apparatus can remove reflections in the windowpane and enhance the boundaries (contours) of a plurality of objects by adding the polarization information to the image information. In addition, the imaging apparatus can detect road surface conditions and further detect obstacles on the road surface. Further, the imaging apparatus can be applied to imaging a pattern reflecting the birefringence of an object, measuring retardation distribution, acquiring a polarizing microscope image, acquiring the surface shape of an object and measuring the surface texture of an object, detecting a moving body (vehicle or the like), performing weather observations such as measuring cloud distribution, and operations in various fields. In addition, the imaging apparatus can also be configured to take three-dimensional images.

The wire grid polarizer may be configured such that the insulation layer is removed, that is, the light reflection layer (made from aluminum, for example) and the light-absorption layer (made from tungsten, for example) are layered from the photoelectric conversion unit 40 side. Alternatively, the wire grid polarizer may be formed from a single conductive light-shielding material layer. The material for the conductive light-shielding material layer may be any of conductive materials with small complex refractive indexes in the wavelength region to which the imaging element is sensitive, such as aluminum (Al), copper (Cu), gold (Au), silver (Ag), platinum (Pt), tungsten (W), and alloys of the foregoing metals.

Figure 8:
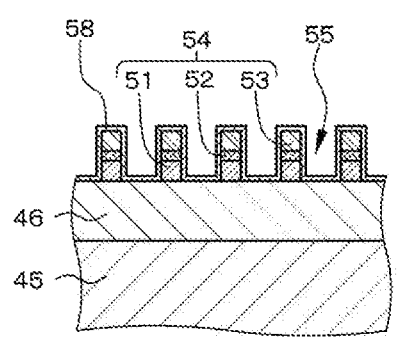
FIG. 8 is a schematic partial end surface view of a wire grid polarizer constituting a modification example of the imaging element in the imaging apparatus of the example 1.

In some cases, a third protective layer 58 made from $SiO_2$, for example, may be formed on side surfaces of the line parts 54 facing the space parts 55 as illustrated in the schematic partial end surface view of the wire grid polarizer of FIG. 8. That is, the space parts 55 are filled with the air and the third protective layer 58 exists on, or is otherwise disposed on, the space parts, where the air includes one or more elements that is in at least one of a gaseous or vapor state. The third protective layer 58 is produced by an HDP-CVD method, for example. This makes it possible to form the further thin third protective layer 58 on the side surfaces of the line parts 54 in a conformal manner. The third protective layer 58 is also applicable to the following examples.

Example 2

Example 2 is a modification example of the example 1, and relates to the imaging element-B of the present disclosure. That is, the on-chip lens (OCL) is arranged on the upper side of the wire grid polarizer. In addition, a wavelength selection layer (specifically, a well-known color filter layer, for example) is arranged between the wire grid polarizer (positioned on the lower side) and the on-chip lens (positioned on the upper side).

Figure 9:
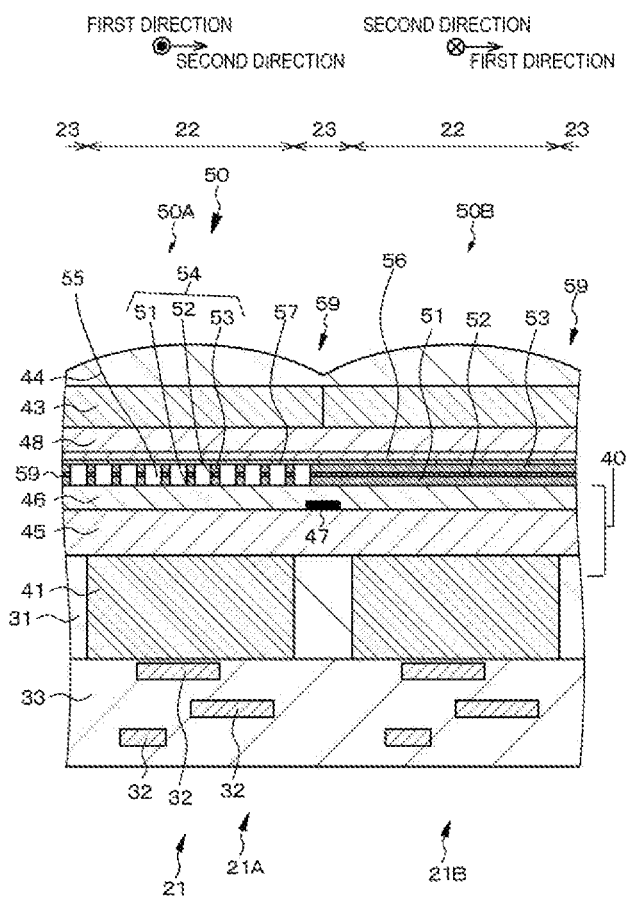
FIG. 9 is a schematic partial end surface view of imaging elements in an imaging apparatus of example 2.
Figure 10:
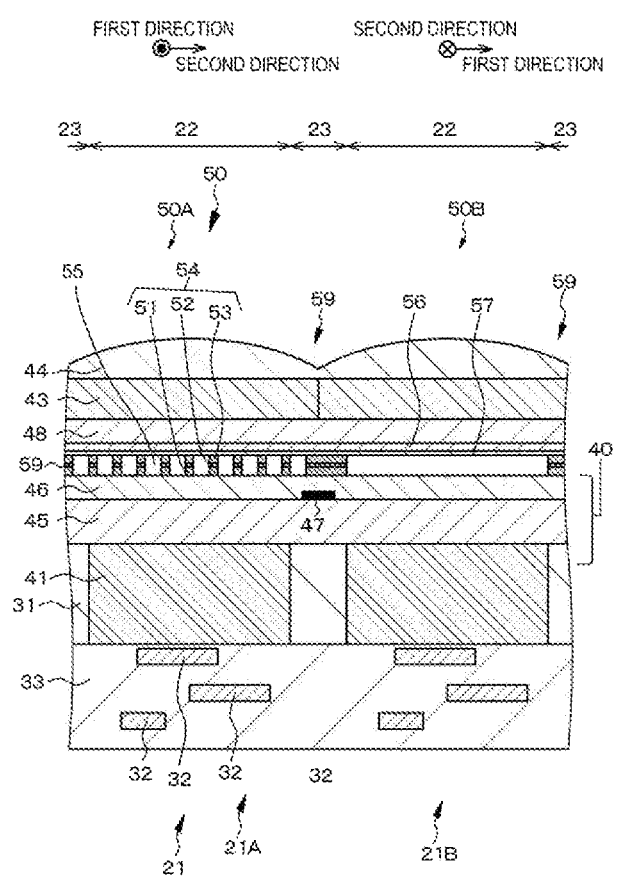
FIG. 10 is a schematic partial end surface view of the imaging elements in the imaging apparatus of the example 2.

Specifically, in the example 2, as illustrated in the schematic partial cross-sectional views of the imaging elements of FIGS. 9 and 10, the flattening layer 45 and the foundation insulation layer 46 are formed on the photoelectric conversion region (light-receiving region) 41, and the wire grid polarizer 50 is formed on the foundation insulation layer 46. Further, the second protective layer 57 and the protective layer 56 are formed on the wire grid polarizer 50 and the spaced parts 55, and a third flattening film 48, the wavelength selection layer (color filter layer 43), and the on-chip lens 44 are formed on the protective layer 56. The spaced parts 55 may be air gaps filled with air, where the air includes one or more elements that is in at least one of a gaseous or vapor state. The space parts 55 may be between a protective layer and another layer, such as an insulation layer for example. The photoelectric conversion unit 40 is formed by the photoelectric conversion region (light-receiving region) 41, the flattening layer 45, and the foundation insulation layer 46. The light-shielding layer 47 is formed on the flattening layer 45. The third flattening film 48 is made from, but not limited to, one or more of $SiO_2$, acrylic resin, SOG, and the like. In the example 2 as well, the imaging elements are arranged in the Bayer array. FIG. 9 is a schematic partial end surface view taken along arrows A-A of FIGS. 3 and 4. FIG. 10 is a schematic partial end surface view taken along arrows B-B in FIGS. 3 and 4.

In the example 2, the wire grid polarizer 50 is arranged between the photoelectric conversion region 41 and the on-chip lens 44 on the side nearer the substrate than the wavelength selection layer (specifically, the color filter layer 43). The formation of the wire grid polarizer 50 is performed prior to formation of the color filter layer and is less limited in processing temperature. Further, the wire grid polarizer 50 is formed under the third flattening film 48. Therefore, it is possible to, when the imaging apparatus is packaged, reliably prevent the occurrence of damage to the wire grid polarizer during the dicing process. In addition, the wire grid polarizer 50 can be provided in the vicinity of the photoelectric conversion region 41 to prevent leakage of light (polarization crosstalk) to the adjacent imaging elements.

Example 3

Figure 11:
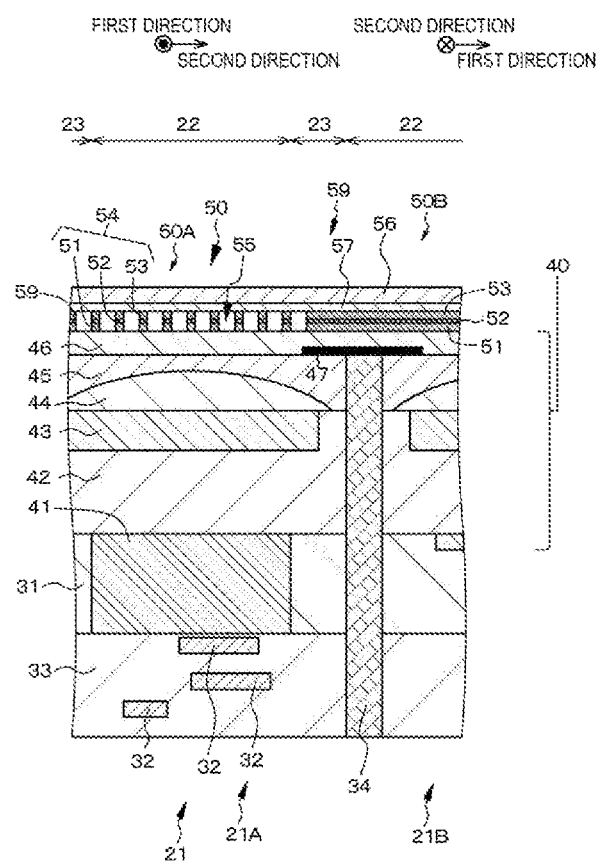
FIG. 11 is a schematic partial end surface view of imaging elements in an imaging apparatus of example 3.
Figure 12:
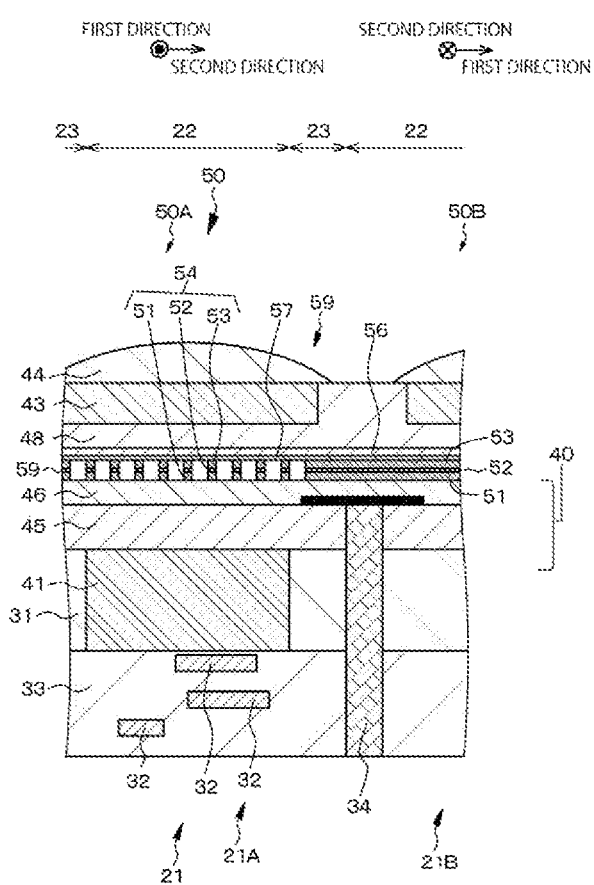
FIG. 12 is a schematic partial end surface view of a modification example of the imaging elements in the imaging apparatus of the example 3.

Example 3 is a modification example of the examples 1 and 2, and relates to the imaging element and the like according to the first-B embodiment and the imaging element and the like according to the second-B embodiment. In the imaging element of the example 3 as illustrated in the schematic partial cross-sectional view of FIG. 11 or 12, the drive circuits 32 are formed on one surface of the substrate 31 to drive the photoelectric conversion unit 40, the photoelectric conversion unit 40 is formed on the other surface of the substrate 31, and a groove part 34 with an insulating material or a light-shielding material embedded therein is formed at the edge portion of the imaging element 21 in such a manner as to range from the one surface to the other surface of the substrate 31 and further extend up to the lower side of the wire grid polarizer 50 (also immediately under the wire grid polarizer 50). The insulating material may be $SiO_2$ for example and the light-shielding material may be tungsten (W) for example. The imaging element of the example 3 illustrated in FIG. 11 is a modification example of the imaging element of the example 1 and corresponds to FIG. 1. In addition, the imaging element of the example 3 illustrated in FIG. 12 is a modification example of the imaging element of the example 2 and corresponds to FIG. 9. The imaging element of the example 3 can be configured and structured in a similar manner as the imaging element of the example 1 or 2, and detailed descriptions of a similar configuration and structure will be omitted.

At a similar step as (step-100) of the example 1, when various drive circuits and wiring (wiring layer) for driving the imaging element are formed on the one surface of the substrate 31 as a silicon semiconductor substrate, part of the groove part 34 is formed in the substrate 31, and at a similar step as (step-110) of the example 1, the photoelectric conversion region 41, the first flattening film 42, the wavelength selection layer (color filter layer 43), the on-chip lens 44, the flattening layer (second flattening film 45) are formed, and then the remaining portion of the groove part 34 is formed in the flattening layer (second flattening film 45), the first flattening film 42, and the substrate 31 (see FIG. 11). Alternatively, at a similar step as (step-100) of the example 1, various drive circuits and wiring (wiring layer) for driving the imaging element are formed on the one surface of the substrate 31 as a silicon semiconductor substrate, and at a similar step as (step-110) of the example 1, the photoelectric conversion region 41, the first flattening film 42, the wavelength selection layer (color filter layer 43), the on-chip lens 44, and the flattening layer (second flattening film 45) are formed, and then the groove part 34 is formed in such a manner as to range from the substrate 31 to the flattening layer (second flattening film 45) from the substrate 31 side or the flattening layer (second flattening film 45) side. The "formation of the groove part" includes a process of embedding the insulating material or the light-shielding material into the groove part 34.

Alternatively, at a similar step as (step-100) of the example 1, when various drive circuits and wiring (one or more wiring layers) for driving the imaging element are formed on the one surface of the substrate 31 as a silicon semiconductor substrate, part of the groove part 34 is formed in the substrate 31, and in the example 2, the flattening layer (second flattening film 45) is formed, and then the remaining portion of the groove part 34 is formed in the flattening layer (second flattening film 45) and the substrate 31 (see FIG. 12). Alternatively, at a similar step as (step-100) of the example 1, when various drive circuits and wiring (wiring layer) for driving the imaging element are formed on the one surface of the substrate 31 as a silicon semiconductor substrate, and in the example 2, the flattening layer (second flattening film 45) is formed, and then the groove part 34 is formed in such a manner as to range from the substrate 31 to the flattening layer (second flattening film 45) from the substrate 31 side or the flattening layer (second flattening film 45) side.

Figure 13:
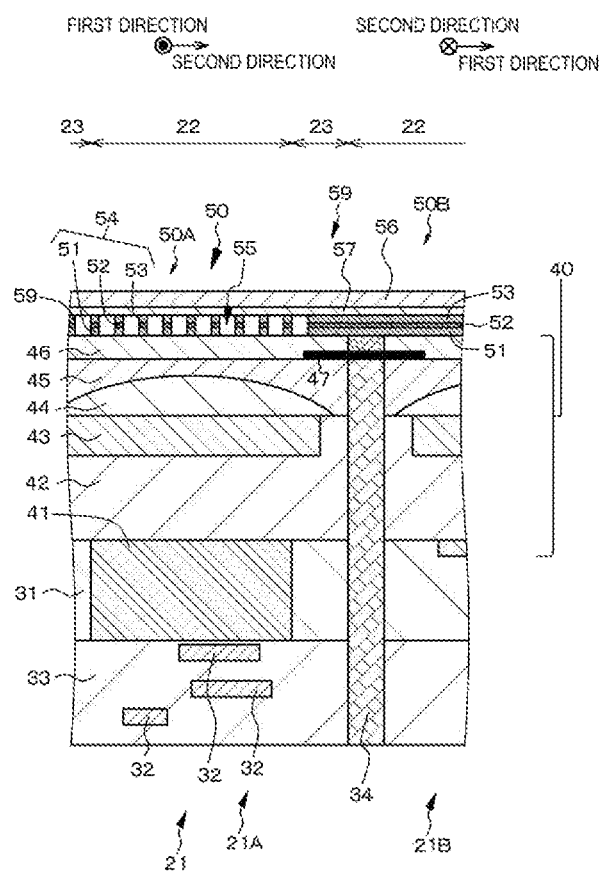
FIG. 13 is a schematic partial end surface view of another modification example of imaging elements in the imaging apparatus of the example 3.
Figure 14A:
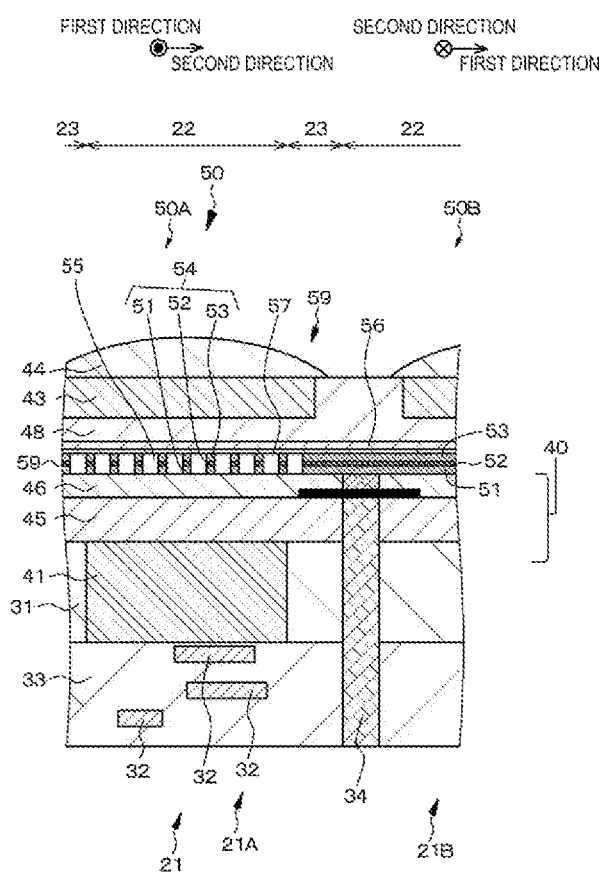
FIG. 14A is a schematic partial end surface view of another modification example of imaging elements in the imaging apparatus of the example 3.
Figure 14B:
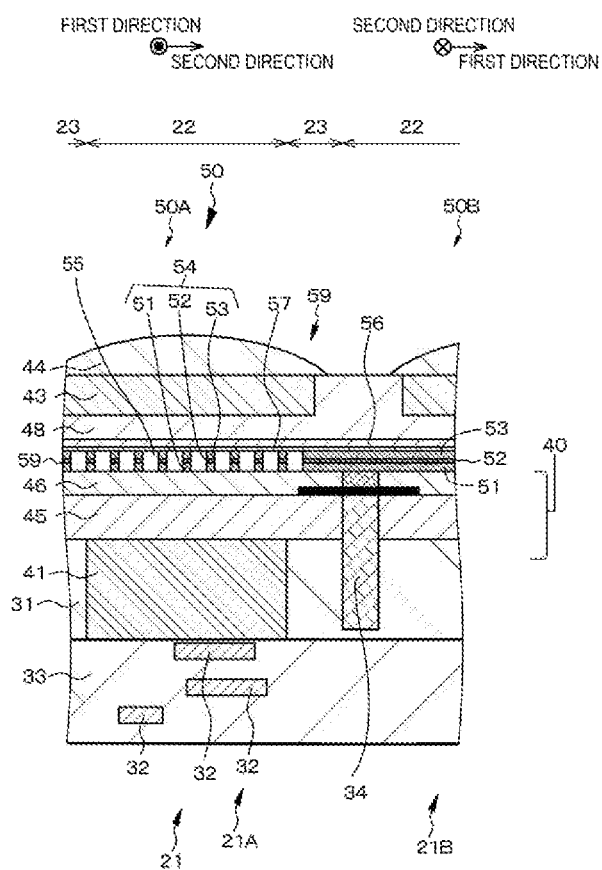
FIG. 14B is a schematic partial end surface view of another modification example of imaging elements in the imaging apparatus of the example 3.
Figure 14C:
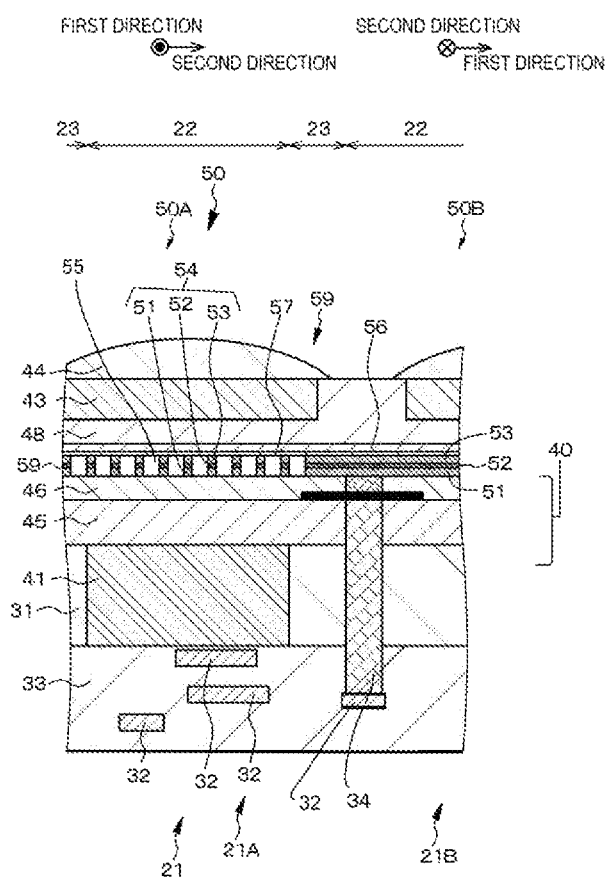
FIG. 14C is a schematic partial end surface view of another modification example of imaging elements in the imaging apparatus of the example 3.
Figure 14D:
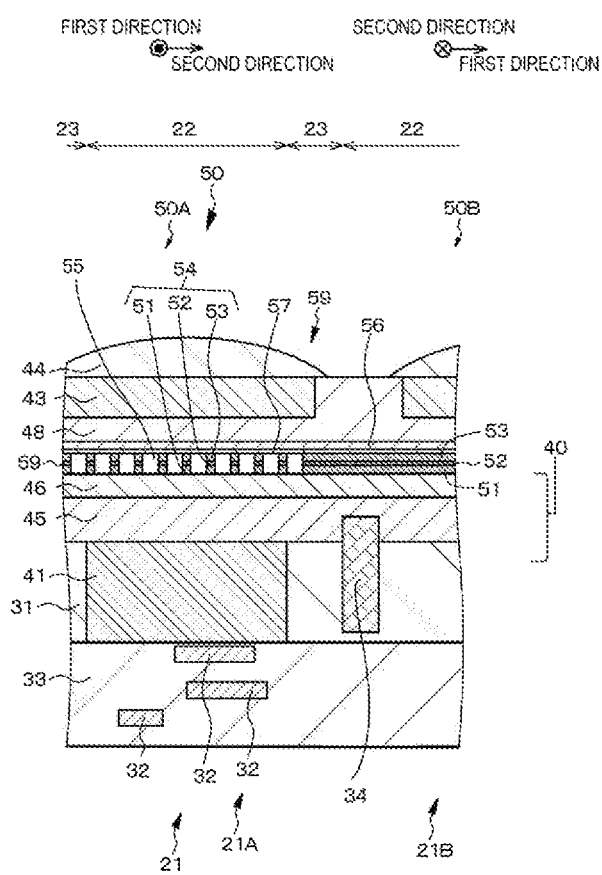
FIG. 14D is a schematic partial end surface view of another modification example of imaging elements in the imaging apparatus of the example 3.
Figure 14E:
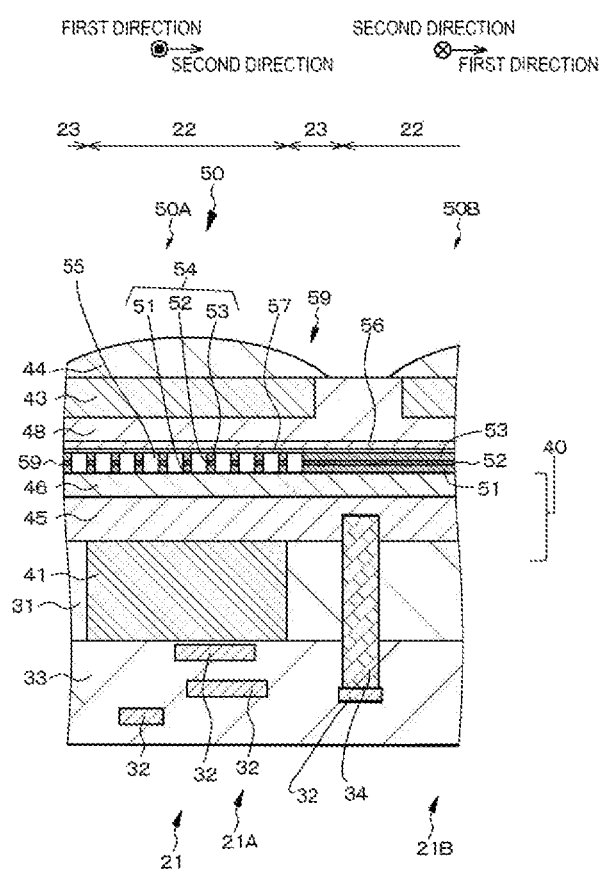
FIG. 14E is a schematic partial end surface view of another modification example of imaging elements in the imaging apparatus of the example 3.

The groove part 34 may be extended up to the foundation insulation layer 46 as in the modification example of FIG. 11 illustrated in FIG. 13 and the modification example of FIG. 12 illustrated in FIGS. 14A-14D.

Example 4

Figure 16:
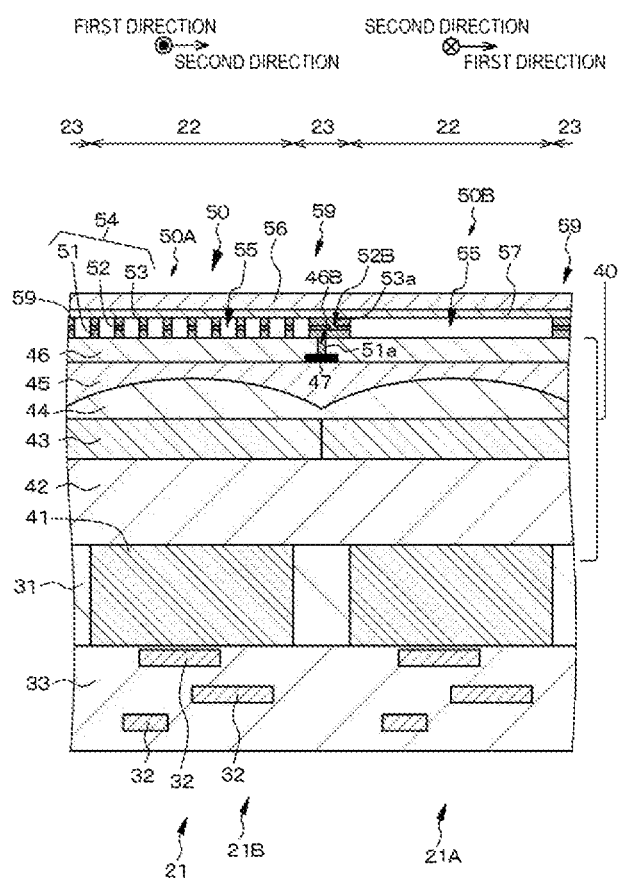
FIG. 16 is a schematic partial end surface view of the imaging elements in the imaging apparatus of example 4.
Figure 17:
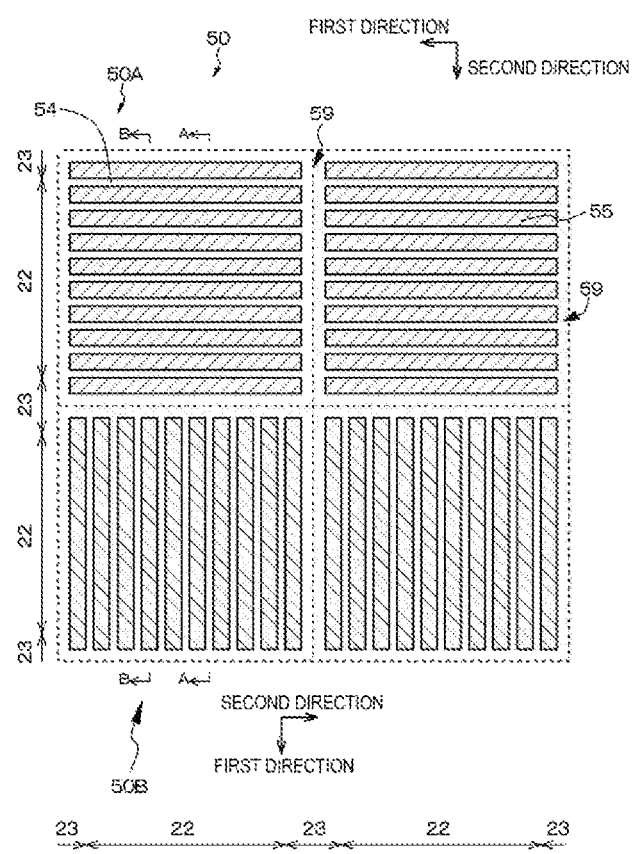
FIG. 17 is a schematic partial end surface view of the imaging elements in the imaging apparatus of the example 4.
Figure 18:
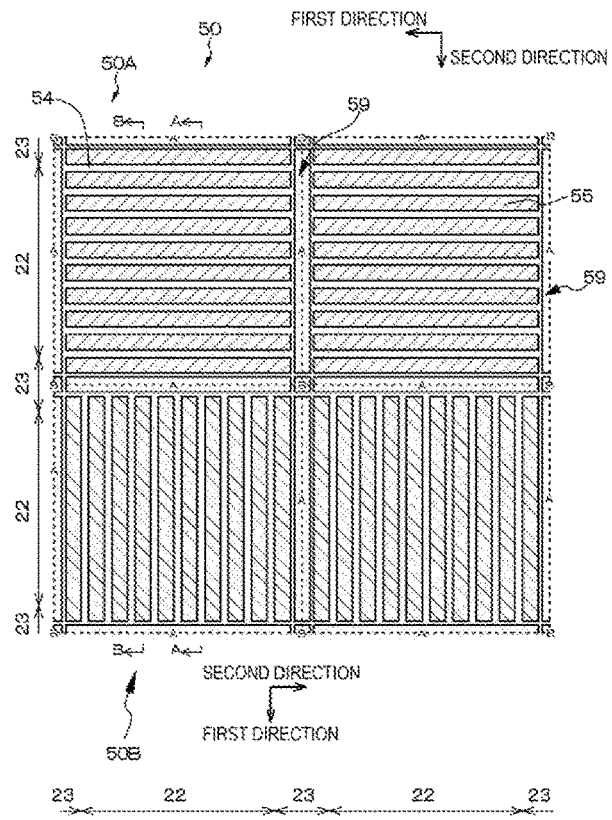
FIG. 18 is a schematic partial end surface view of the imaging elements in the imaging apparatus of the example 4.
Figure 19:
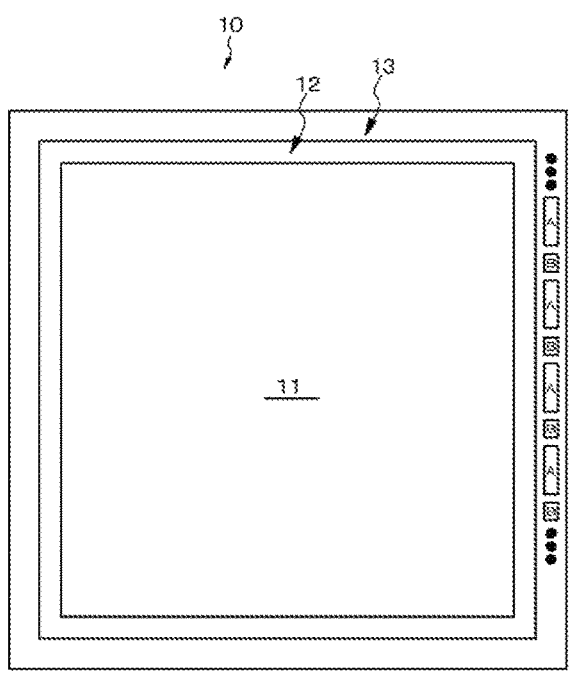
FIG. 19 is a schematic plane view of the imaging apparatus illustrating an imaging region and the like in the imaging apparatus of the example 4.

Example 4 is a modification example of the examples 1 to 3, and relates to the imaging element and the like according to the first-C embodiment and the imaging element and the like according to the second-C embodiment. FIGS. 15 and 16 are schematic partial end surface views of imaging elements constituting the imaging apparatus of the example 4. FIGS. 17 and 18 are schematic partial plane views of the imaging elements in the imaging apparatus of the example 4. FIG. 19 is a schematic plane view of the imaging apparatus illustrating an imaging region and the like in the imaging apparatus of the example 4. FIGS. 15 and 16 illustrate two imaging elements, and FIGS. 17 and 18 illustrate four imaging elements. In addition, FIG. 15 is a schematic partial end surface view along arrows A-A of FIGS. 17 and 18, FIG. 16 is a schematic partial end surface view along arrows B-B of FIGS. 17 and 18, which are the schematic partial end surface view of the imaging elements along the direction of extension of the line-and-space structure in the wire grid polarizer (first direction) and the schematic partial end surface view of the imaging elements along the second direction. Further, in FIGS. 17 and 18, the boundaries between the imaging elements are marked with dotted lines, and the gaps (space parts) between the line parts are marked with oblique lines.

In the example 4, an extension part 51a of the light reflection layer 51 is electrically connected to the substrate 31 or the photoelectric conversion unit 40. Specifically, the extension part 51a of the light reflection layer 51 is connected to the light-shielding layer 47 constituting the photoelectric conversion unit 40.

In the example 4, the region where the photoelectric conversion unit 40 and the extension part 51a of the light reflection layer 51 (or the light reflection layer formative layer 51A) are electrically connected is positioned in the imaging region 11. The region where the photoelectric conversion unit 40 and the extension part 51a of the light reflection layer 51 (or the light reflection layer formative layer 51A) are electrically connected may be provided for each of the imaging elements, or may be provided for a plurality of imaging elements, or may be provided for all the imaging elements. The region where the substrate 31 or the photoelectric conversion unit 40 and the extension part 51a of the light reflection layer 51 (or the light reflection layer formative layer 51A) are electrically connected may be positioned in the optical black pixel region (OPB) 12 on the outer periphery of the imaging region, or may be positioned in the peripheral region 13 outside the imaging region 11.

The light-shielding layer 47 is formed in the region 23 between the imaging elements, and the extension part 51a of the light reflection layer 51 is in contact with the region of the light-shielding layer 47. In FIG. 18, the portions of the extension part 51a of the light reflection layer 51 in contact with the region of the light-shielding layer 47 are surrounded by rectangles with reference sign "A" for the sake of convenience. The length of the extension part 51a of the light reflection layer 51 in contact with the region of the light-shielding layer 47 is identical to the length of the photoelectric conversion region 41. By employing this structure, it is possible to prevent the occurrence of crosstalk from the adjacent imaging elements. In addition, the region of contact between the light reflection layer 51 (the light reflection layer formative layer 51A) and the light-absorption layer 53 (the light-absorption layer formative layer 53A) is positioned in the region 23 between the imaging elements and set at least at one of the four corners of the imaging element (specifically, at the four corners). In FIG. 18, the regions of contact between the light reflection layer 51 (the light reflection layer formative layer 51A) and the light-absorption layer 53 (the light-absorption layer formative layer 53A) are surrounded by rectangles with reference sign "B" for the sake of convenience. The positions of the extension part 51a of the light reflection layer 51 (the light reflection layer extension part 51A) and an extension part 53a of the light-absorption layer formative layer 53A illustrated in FIGS. 15 and 16 and the positions of the extension parts 51a and 53a illustrated in FIG. 18 are different from each other for the sake of simplified illustration. In some cases, the portion A of the extension part 51a of the light reflection layer 51 in contact with the region of the light-shielding layer 47 may surround the imaging element, and the region of contact B between the light reflection layer 51 (the light reflection layer formative layer 51A) and the light-absorption layer 53 (the light-absorption layer formative layer 53A) may surround the imaging element.

A manufacturing method of the imaging element and the imaging apparatus of the example 4 will be explained with reference to FIGS. 20A to 20D as schematic partial cross-sectional views of the substrate and the like. The imaging element of the example 4 can be manufactured according to the following steps:

(A) forming the photoelectric conversion unit 40 and providing the light reflection layer formative layer 51A that is made from the first conductive material and is electrically connected to the substrate 31 or the photoelectric conversion unit 40 on the photoelectric conversion unit 40;

(B) providing the insulation layer formative layer 52A on the light reflection layer formative layer 51A, and providing the light-absorption layer formative layer 53A that is made from the second conductive material and is in at least partial contact with the light reflection layer formative layer 51A on the insulation layer formative layer 52A; and (C) patterning the light-absorption layer formative layer 53A, the insulation layer formative layer 52A, and the light reflection layer formative layer 51A to obtain the wire grid polarizer 50 in which a plurality of line parts (layered structures) 54 formed from the belt-like, or strip-shaped, light reflection layer 51, the insulation layer 52, and the light-absorption layer 53 is arranged in parallel with spacing therebetween. The line parts, or strip-shaped portions, may be shaped generally like a rectangular parallelepiped, where face angles are substantially right angles so all faces are shaped like rectangles and all dihedral angles are substantially right angles.

At the step (B), the light-absorption layer formative layer 53A made from the second conductive material may be formed while the light reflection layer formative layer 51A is set at a predetermined potential via the substrate 31 or the photoelectric conversion unit 40, and at the step (C), the light-absorption layer formative layer 53A, the insulation layer formative layer 52A, and the light reflection layer formative layer 51A may be patterned while the light reflection layer formative layer 51A is set at a predetermined potential via the substrate 31 or the photoelectric conversion unit 40.

(Step-400)

First, a similar step as (step-100) of the example 1 is executed. Then, a similar step as (step-110) of the example 1 is executed. A first opening 46B is formed in the foundation insulation layer 46 positioned on the upper side of the light-shielding layer 47.

(Step-410)

Figure 20A:
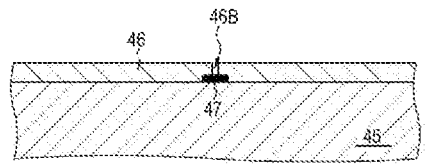
FIGS. 20A to 20D are schematic partial end surface views of substrates and the like for describing a manufacturing method of the imaging element and the imaging apparatus of the example 1.
Figure 20B:
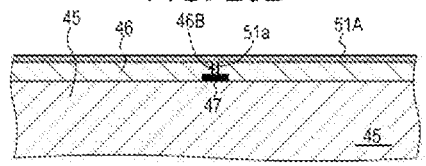
Figure 20C:
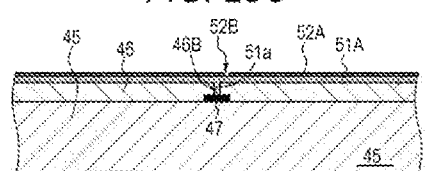
Figure 20D:
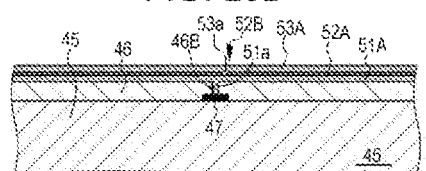

Next, the light reflection layer formative layer 51A made from the first conductive material (specifically, aluminum) is provided on the photoelectric conversion unit 40 (specifically, the foundation insulation layer 46) by a vacuum evaporation method (see FIGS. 20A and 20B). The light reflection layer formative layer 51A is extended up to the top surface of the light-shielding layer 47 from the first opening 46B. That is, the light reflection layer formative layer 51A made from the first conductive material is electrically connected to the substrate 31 or the photoelectric conversion unit 40 (specifically, the light-shielding layer 47 in the example 4).

The portion of connection between the light reflection layer formative layer 51A and the light-shielding layer 47 is shown with reference number 51a.

(Step-420)

After that, the insulation layer formative layer 52A is provided on the light reflection layer formative layer 51A, and the light-absorption layer formative layer 53A that is made from the second conductive material and is in at least partial contact with the light reflection layer formative layer 51A is provided on the insulation layer formative layer 52A. Specifically, the insulation layer formative layer 52A made from $SiO_2$ is formed on the light reflection layer formative layer 51A by a CVD method. After that, a second opening 52B is formed by a photolithography technique and an etching technique in the insulation layer formative layer 52A positioned on the upper side of a desired region of the light reflection layer formative layer 51A on which the line parts (layered structures) 54 are to be formed. Accordingly, the structure illustrated in FIG. 20C can be obtained. Then, the light-absorption layer formative layer 53A made from tungsten (W) is formed by a sputtering method on the insulation layer formative layer 52A including the second opening 52B. Accordingly, the structure illustrated in FIG. 20D can be obtained. The light reflection layer formative layer 51A and the light-absorption layer formative layer 53A are in contact with each other via the extension part 53a of the light-absorption layer formative layer 53A extending in the second opening 52B. At this step, the light-absorption layer formative layer 53A is provided while the light reflection layer formative layer 51A is set at a predetermined potential via the substrate 31 or the photoelectric conversion unit 40 (specifically, while the light reflection layer formative layer 51A is grounded via the light-shielding layer 47 in the example 4).

(Step-430)

Then, the light-absorption layer formative layer 53A, the insulation layer formative layer 52A, and the light reflection layer formative layer 51A are patterned by a lithography technique and a dry etching technique, thereby to obtain the wire grid polarizer 50 in which a plurality of line parts (layered structures) 54 of the belt-like, or strip-shaped, light reflection layer 51, insulation layer 52, and light-absorption layer 53 is arranged in parallel with spacing therebetween. At this step, the light-absorption layer formative layer 53A, the insulation layer formative layer 52A, and the light reflection layer formative layer 51A are patterned while the light reflection layer formative layer 51A is set at a predetermined potential via the substrate 31 or the photoelectric conversion unit 40 (specifically, while the light reflection layer formative layer 51A is grounded via the light-shielding layer 47 in the example 4). In addition, the regions 23 between the imaging elements are occupied by the frame part 59, and the optical black pixel region (OPB) 12 and the peripheral region 13 are occupied by the same layered structure as the frame part formed from the light reflection layer 51, the insulation layer 52, and the light-absorption layer 53.

(Step-440)

After that, similar steps as (step-150) and (step-160) of the example 1 are executed to obtain the imaging apparatus of the example 4.

In the imaging element of the example 4, the light reflection layer formative layer is electrically connected to the photoelectric conversion unit, and the extension part of the light reflection layer is electrically connected to the photoelectric conversion unit. Therefore, at the time of formation of the wire grid polarizer, it is possible to reliably prevent the occurrence of a problem that the light reflection layer formative layer and the light-absorption layer formative layer become electrically charged to cause discharge and the wire grid polarizer and the photoelectric conversion unit are damaged.

Instead of electrically connecting the light reflection layer formative layer 51A to the photoelectric conversion unit 40, the light reflection layer formative layer 51A may be connected to the substrate 31 (for example, the drive circuits and wiring, and the wiring layer 32). In addition, the region in which the substrate 31 or the photoelectric conversion unit 40 and the light reflection layer formative layer 51A are electrically connected may be positioned in the optical black pixel region (OPB) 12 on the outer periphery of the imaging region 11, or may be positioned in the peripheral region 13 outside the imaging region 11. That is, the light-shielding layer is formed also in the peripheral region 13, and the extension part 51a of the light reflection layer 51 is in contact with the region of the light-shielding layer. The length of the extension part of the light reflection layer in contact with the region of the light-shielding layer may be any length. In the right part of FIG. 19, the portions of the extension part 51a of the light reflection layer 51 in contact with the region of the light-shielding layer 47 are surrounded by rectangles with reference sign "A" for the sake of convenience. In addition, in FIG. 19, the regions of contact between the light reflection layer 51 (the light reflection layer formative layer 51A) and the light-absorption layer 53 (the light-absorption layer formative layer 53A) are surrounded by rectangles with reference sign "B" for the sake of convenience. FIG. 19 shows only some of the regions A and the regions B. When dicing is performed to cut off the chips, the region where the substrate 31 or the photoelectric conversion unit 40 and the light reflection layer formative layer 51A are electrically connected may be positioned at a scribe part between the imaging apparatuses.

The present disclosure has been explained so far on the basis of the preferred examples. However, the present disclosure is not limited to these examples. The configurations and structures of the wire grid polarizers, the imaging elements, and the imaging apparatuses explained in relation to the examples are exemplifications and can be changed as appropriate, and the manufacturing methods are exemplifications and can be changed as appropriate. In relation to the examples, the imaging element by combination of the imaging element according to the first embodiment of the present disclosure and the imaging element according to the second embodiment of the present disclosure has been mainly explained. However, the imaging element according to the first embodiment of the present disclosure and the imaging element according to the second embodiment of the present disclosure are established as independent disclosures. In addition, the imaging element in which the groove part (a kind of element separation region) with an insulating material or a light-shielding material embedded therein is formed at the edge portion of the imaging element in such a manner as to range from the one surface to the other surface of the substrate and further extend up to the lower side of the wire grid polarizer is established as an independent technique. The imaging element may be of a back side-illuminated type or a front side-illuminated type. Specifically, the imaging element may be configured such that the photoelectric conversion region 41 is provided on the silicon semiconductor substrate, and the first flattening film 42, the wavelength selection layer (color filter layer) 43, the on-chip lens 44, the flattening layer (second flattening film) 45, the light-shielding layer 47, the foundation insulation layer 46, and the wire grid polarizer 50 are layered on the photoelectric conversion region 41. Alternatively, the imaging element may be configured such that the photoelectric conversion region 41 is provided on the silicon semiconductor substrate, and the flattening layer 45, the light-shielding layer 47, the foundation insulation layer 46, the wire grid polarizer 50, the third flattening film 48, the wavelength selection layer (color filter layer) 43, and the on-chip lens 44 are layered on the photoelectric conversion region 41.

In addition, in some of the examples, the wire grid polarizer is used mainly to acquire polarization information on the imaging element sensitive to the visible light wavelength band. However, when the imaging element is sensitive to infrared rays or ultraviolet rays, the wire grid polarizer can be implemented to serve in any wavelength band by increasing or decreasing the formation pitch $P_0$ of the line parts according to the sensitivity. In addition, the wire grid polarizer in which a plurality of the line parts (layered structures) formed by layering the light reflection layer, the insulation layer, and the light-absorption layer from the photoelectric conversion unit side is arranged in parallel with spacing therebetween, the insulation layer is formed on the entire top surface of the light reflection layer, and the light-absorption layer is formed on the entire top surface of the insulation layer can constitute a technique by itself.

The arrangement state of the imaging elements in the imaging element unit with the Bayer array is not limited to the arrangement illustrated in FIG. 21. In the plane layout diagrams of the imaging element units illustrated in FIGS. 20 to 35 explained below, "R" represents red imaging elements with red color filter layers, "G" represents green imaging elements with green color filter layers, "B" represents blue imaging elements with blue color filter layers, and "W" represents white imaging elements with no color filter layers.

As illustrated in FIG. 20, as for the angle formed by the array direction of the plurality of imaging elements and the first direction, the imaging elements having an angle of 45 degrees and the imaging elements having an angle of 135 degrees may be combined, for example.

Figure 23:
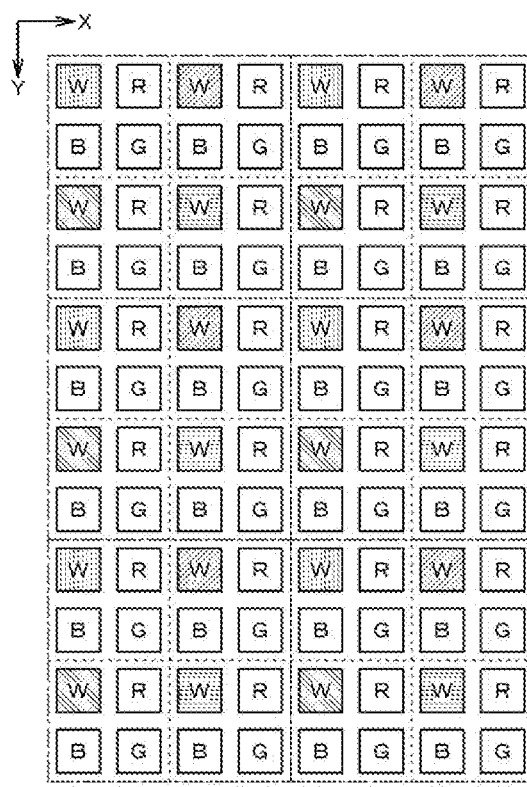
FIG. 23 is a conceptual view of a modification example of the imaging element unit having the Bayer array in the imaging apparatuses of the examples 1 to 4.

In the example of FIG. 23, the red imaging elements R, the green imaging elements G, and the blue imaging elements B are not provided with the wire grid polarizers 50, and the white imaging elements W are provided with the wire grid polarizers 50. In FIG. 23, the white imaging elements W having the wire grid polarizers 50 are arranged alternately with other imaging elements in the X direction and the Y direction. Alternatively, the white imaging elements W may be arranged at intervals of two each other imaging elements or three each other imaging elements. Still alternatively, the imaging elements with the wire grid polarizers 50 may be arranged in a hound's-tooth check pattern.

Figure 24:
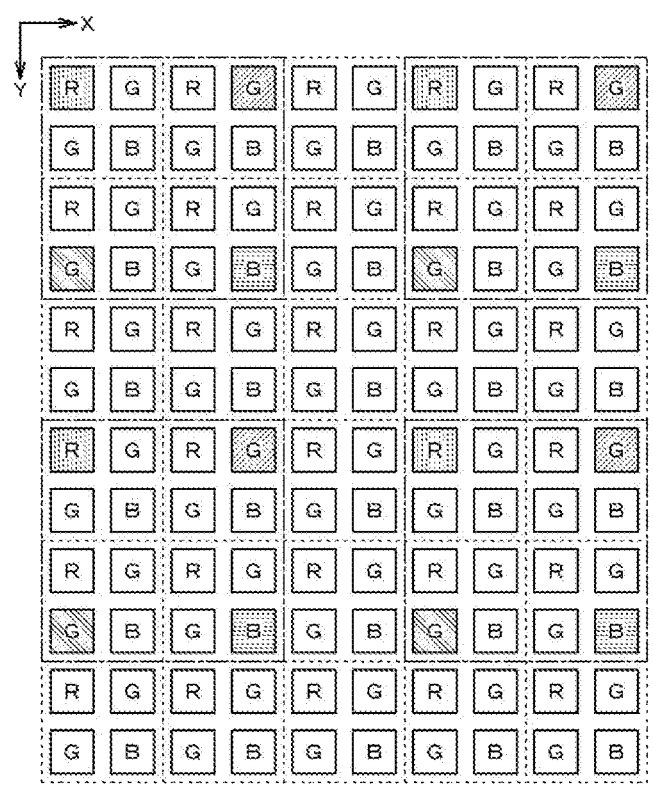
FIG. 24 is a conceptual view of a modification example of the imaging element unit having the Bayer array in the imaging apparatuses of the examples 1 to 4.

As illustrated in the plane layout view of FIG. 24, the color filter layers may be arranged in the Bayer array such that red, green, blue, and green color filter layers are arranged in one imaging element unit (one pixel) composed of 2×2, total four imaging elements, one imaging element unit group is formed from four imaging element units, and the wire grid polarizer is arranged in one of the four imaging elements constituting each imaging element unit.

Figure 25:
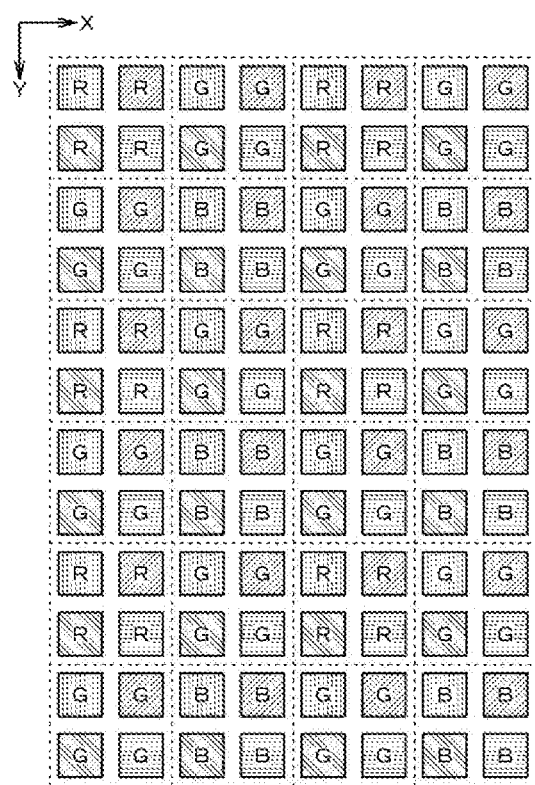
FIG. 25 is a conceptual view of a modification example of the imaging element unit having the Bayer array in the imaging apparatuses of the examples 1 to 4.
Figure 26:
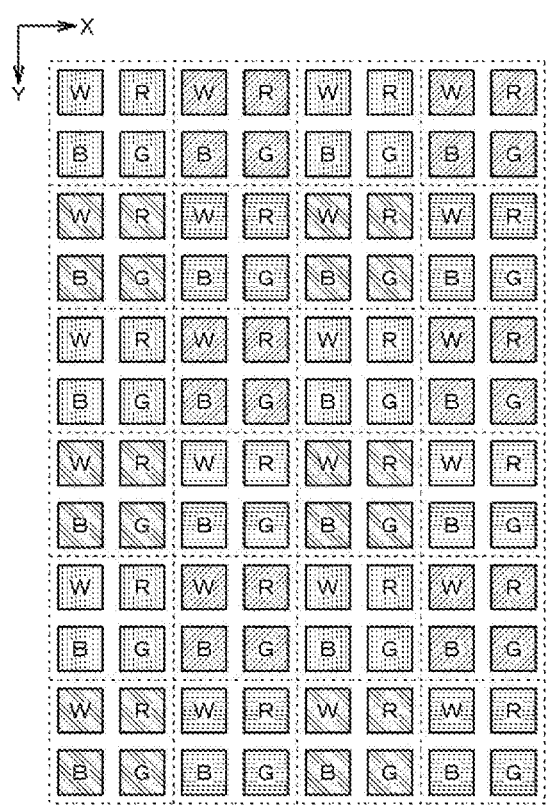
FIG. 26 is a conceptual view of a modification example of the imaging element unit having the Bayer array in the imaging apparatuses of the examples 1 to 4.
Figure 27:
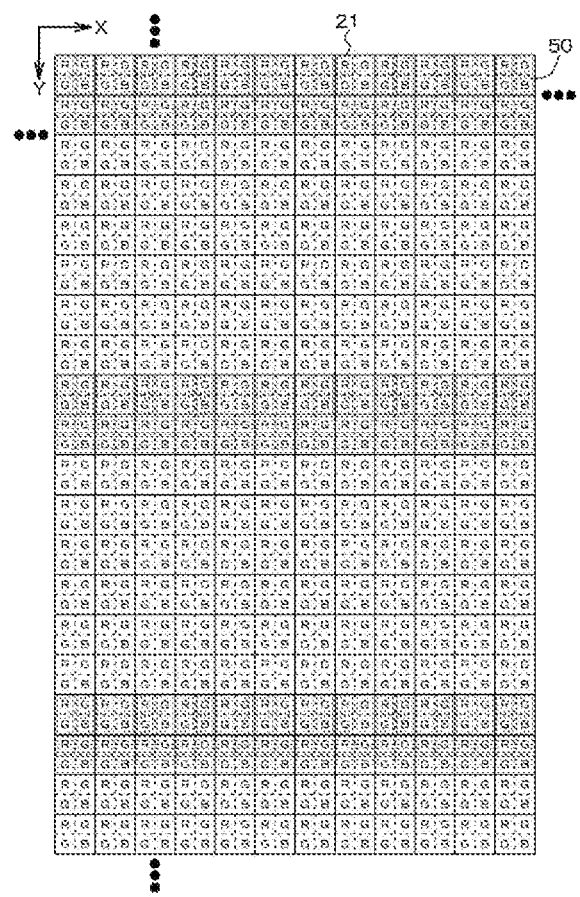
FIG. 27 is a conceptual view of a modification example of the imaging element unit having the Bayer array in the imaging apparatuses of the examples 1 to 4.
Figure 28:
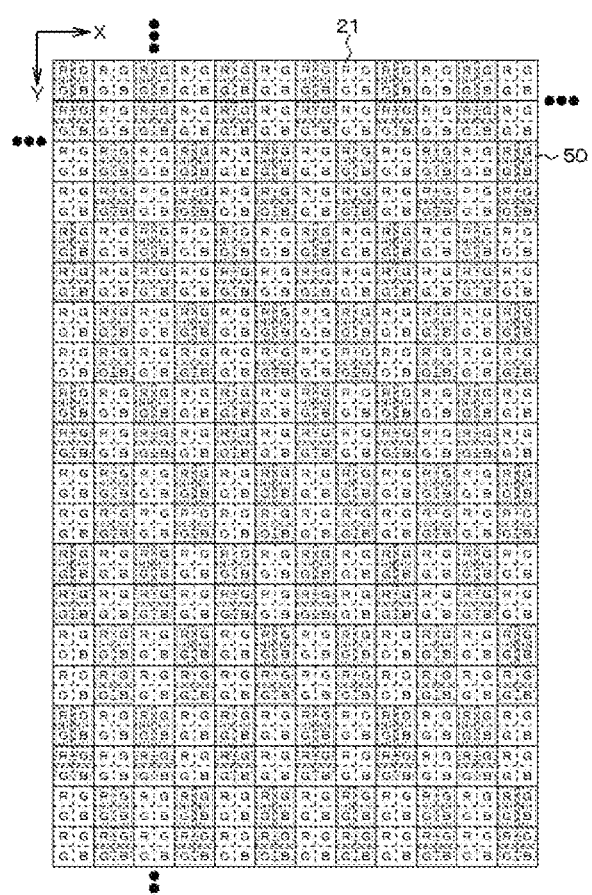
FIG. 28 is a conceptual view of a modification example of the imaging element unit having the Bayer array in the imaging apparatuses of the examples 1 to 4.
Figure 29:
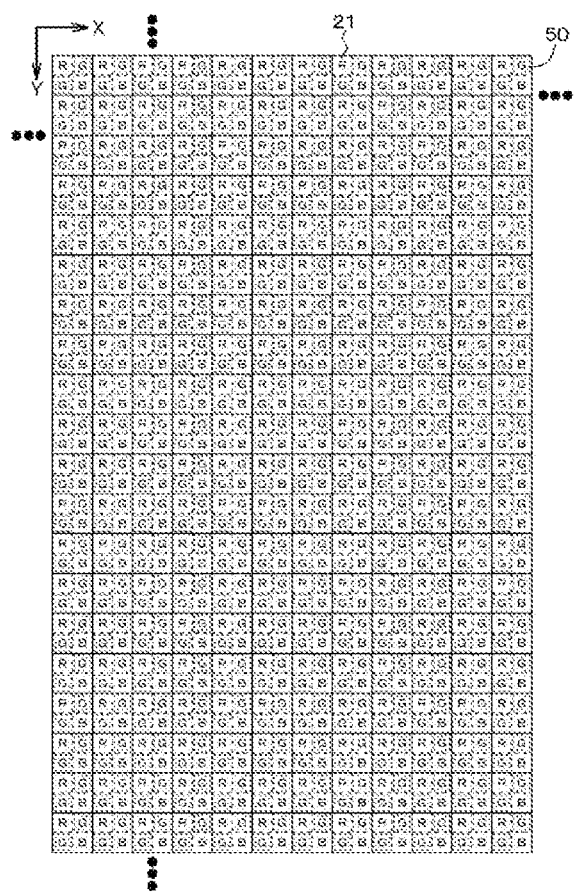
FIG. 29 is a conceptual view of a modification example of the imaging element unit having the Bayer array in the imaging apparatuses of the examples 1 to 4.
Figure 30:
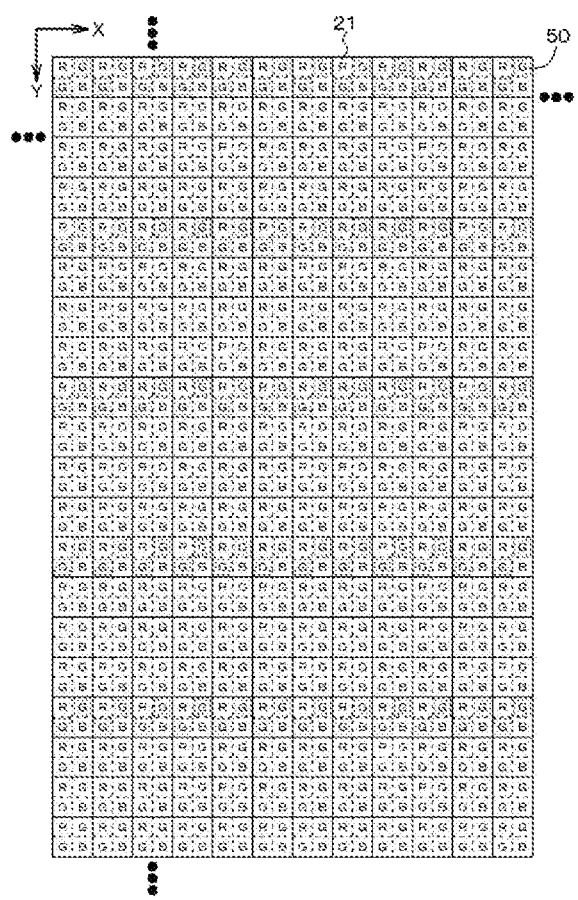
FIG. 30 is a conceptual view of a modification example of the imaging element unit having the Bayer array in the imaging apparatuses of the examples 1 to 4.
Figure 31:
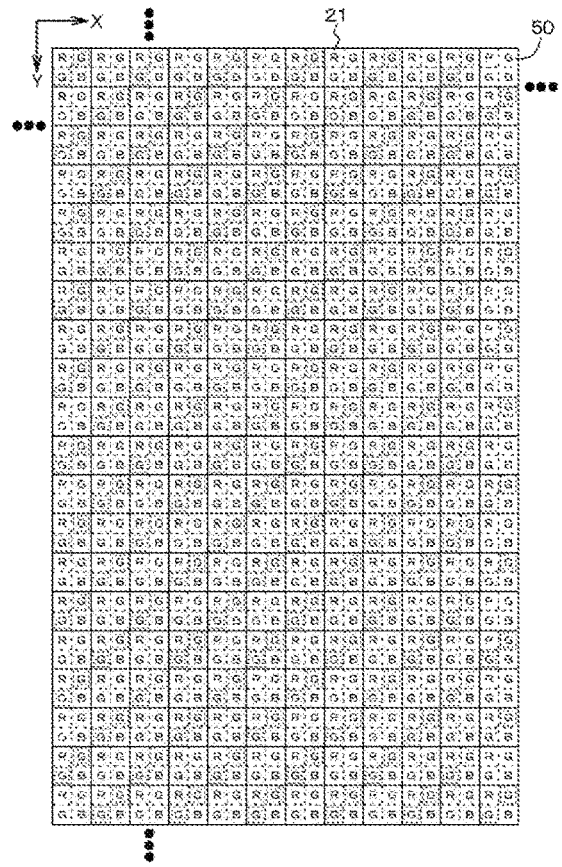
FIG. 31 is a conceptual view of a modification example of the imaging element unit having the Bayer array in the imaging apparatuses of the examples 1 to 4.
Figure 32:
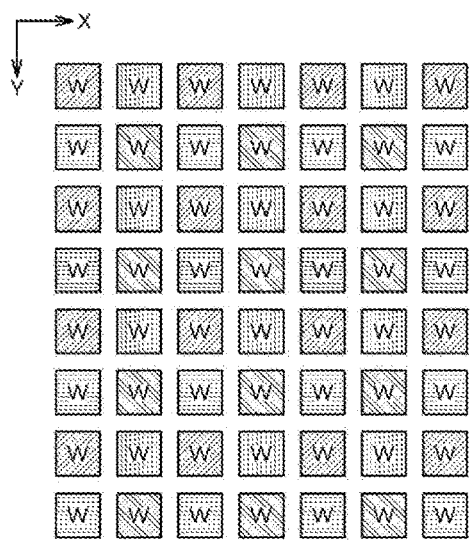
FIG. 32 is a conceptual view of a modification example of the imaging element unit having the Bayer array in the imaging apparatuses of the examples 1 to 4.
Figure 33:
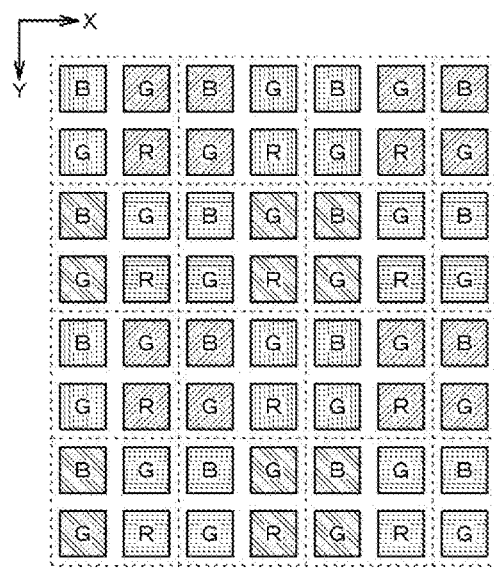
FIG. 33 is a conceptual view of a modification example of the imaging element unit having the Bayer array in the imaging apparatuses of the examples 1 to 4.
Figure 34:
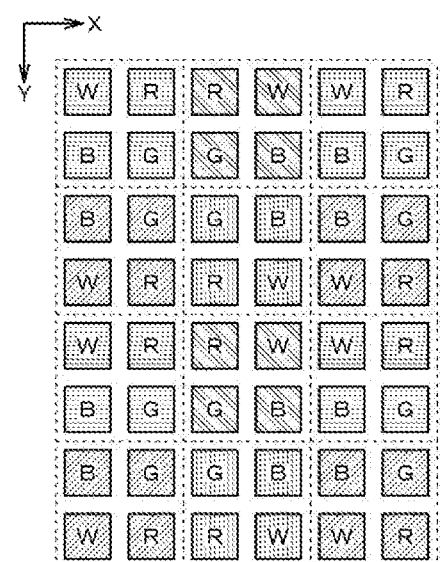
FIG. 34 is a conceptual view of a modification example of the imaging element unit having the Bayer array in the imaging apparatuses of the examples 1 to 4.
Figure 35:
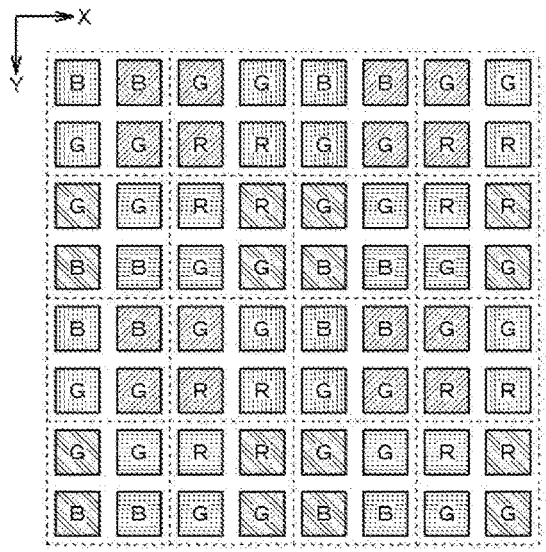
FIG. 35 is a conceptual view of a modification example of the imaging element unit having the Bayer array in the imaging apparatuses of the examples 1 to 4.

The configurations illustrated in the plane layout views of FIGS. 25 and 26 can be also used. In the case of a CMOS imaging sensor with the plane layout illustrated in FIG. 25, a 2×2 pixel sharing method can be employed by which 2×2 imaging elements share a selection transistor, a reset transistor, and an amplification transistor. In an imaging mode without pixel additions, it is possible to perform imaging with polarization information. In a mode in which accumulated charge in 2×2 sub pixel areas are FD-added, it is possible to provide images of all polarization components. In addition, in the case of the plane layout of FIG. 26, 2×2 imaging elements are provided with the wire grid polarizers in one direction. Accordingly, it is possible to allow high-quality polarized imaging because discontinuity in the layered structure between the imaging element units is unlikely to take place.

Further, the configurations illustrated in the plane layout views of FIGS. 27 to 35 can also be used.

Figure 36:
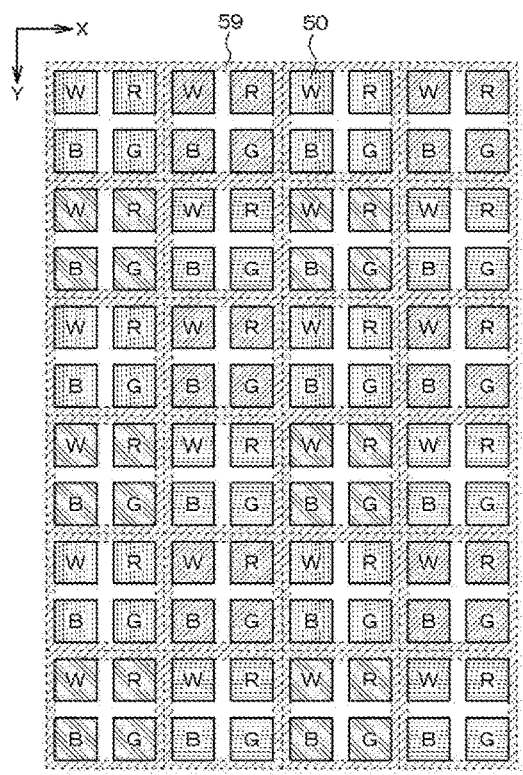
FIG. 36 is a conceptual view of an imaging element unit in a modification example of an imaging apparatus according to a second embodiment of the present disclosure.
Figure 37:
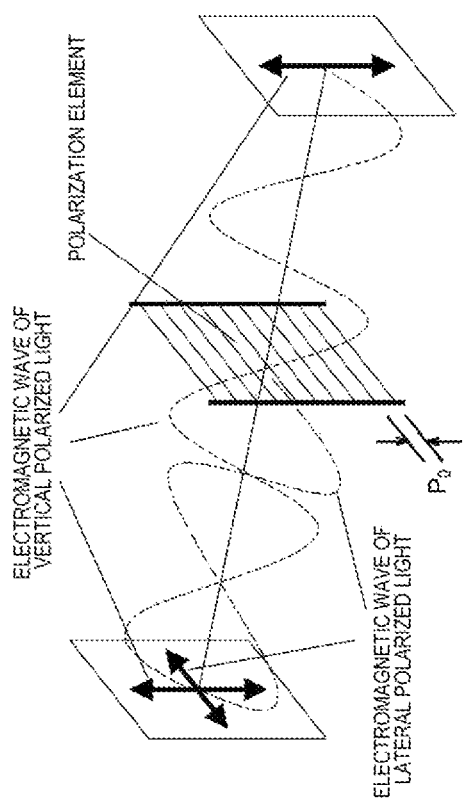

In addition, in the imaging apparatus according to the second embodiment of the present disclosure, when one imaging element unit is formed from a plurality of imaging elements and the imaging elements are equal in the direction of extension of the line-and-space structure (first direction), the frame part 59 may not be necessarily provided between adjacent imaging elements in the imaging element unit in some cases as illustrated in the plane layout view of FIG. 36 as a modification example of FIG. 26. In FIG. 36, the frame part 59 is hatched from the upper right side to the lower left side, and the regions without the frame part between adjacent imaging elements in the imaging element unit are shown in solid-white form.

It should be understood by those skilled in the art that various modifications, combinations, sub-combinations and alterations may occur depending on design requirements and other factors insofar as they are within the scope of the appended claims or the equivalents thereof.

The present disclosure can also be configured as follows:

[A01] <<Imaging Element: First Embodiment>>

An imaging element including:
a photoelectric conversion unit formed on a substrate;
a wire grid polarizer that is disposed on the light-incident side of the photoelectric conversion unit and has a line-and-space structure; and a protective layer formed on the wire grid polarizer, wherein space parts of the wire grid polarizer are air gaps.

[A02] The imaging element according to [A01], wherein
a second protective layer is formed between the wire grid polarizer and the protective layer, and
when the refractive index of the material for the protective layer is designated as $n_1$ and the refractive index of the material for the second protective layer is designated as $n_2$, the relationship $n_1 > n_2$ is satisfied.

[A03] The imaging element according to [A02], wherein the protective layer is made from SiN, and the second protective layer is made from $SiO_2$ or SiON.

[A04] The imaging element according to any one of [A01] to [A03], wherein a third protective layer is formed at least on side surfaces of line parts facing the space parts of the wire grid polarizer.

[A05] The imaging element according to any one of [A01] to [A04], further including a frame part surrounding the wire grid polarizer, wherein
the frame part and the line parts of the wire grid polarizer are coupled together, and
the frame part is structured in the same manner as the line parts of the wire grid polarizer.

[A06] The imaging element according to any one of [A01] to [A05], wherein a drive circuit driving the photoelectric conversion unit is formed on one surface of a substrate, the photoelectric conversion unit is formed on the other surface of the substrate, and a groove part with an insulating material or a light-shielding material embedded is formed at an edge portion of the imaging element in such a manner as to range from the one surface to the other surface of the substrate and further extend up to the lower side of the wire grid polarizer.

[A07] The imaging element according to any one of [A01] to [A06], wherein the line parts of the wire grid polarizer are formed from layered structures in which a light reflection layer made from a first conducive material, an insulation layer, and a light-absorption layer made from a second conductive material are layered from the photoelectric conversion unit side.

[A08] The imaging apparatus according to [A07] wherein a foundation film is formed between the photoelectric conversion unit and the light reflection layer.

[A09] The imaging element according to [A07] or [A08], wherein an extension part of the light reflection layer is electrically connected to the substrate or the photoelectric conversion unit.

[A10] The imaging element according to any one of [A07] to [A09], wherein the insulation layer is formed on the entire top surface of the light reflection layer, and the light-absorption layer is formed on the entire top surface of the insulation layer.

[A11] An imaging element including
a photoelectric conversion unit formed on a substrate;
a wire grid polarizer disposed at a light-incident side of the photoelectric conversion unit, the wire grid polarizer including a plurality of strip-shaped portions; and
a protective layer formed on the wire grid polarizer,
wherein the wire grid polarizer includes air gaps between adjacent strip-shaped portions of the plurality of strip-shaped portions. polarizer are air gaps.

[A12] The imaging element according to [A11], further including a second protective layer formed between the wire grid polarizer and the protective layer, wherein a refractive index of a material of the protective layer is greater than a refractive index of a material of the second protective layer.

[A13] The imaging element according to [A11] or [A12], wherein the air gaps between adjacent strip-shaped portions of the plurality of strip-shaped portions are also between the protective layer and at least one of a second protective layer or an insulation layer.

[A14] The imaging element according to any one of [A11] to [A13], wherein the protective layer includes SiN and a second protective layer includes at least one of SiO$_2$ or SiON.

[A15] The imaging element according to any one of [A11] to [A14], further including a protective layer formed on side surfaces of the strip-shaped portions.

[A16] The imaging element according to any one of [A11] to [A15], further including:
a frame portion at least partially surrounding the wire grid polarizer, wherein the frame portion is coupled to the plurality of strip-shaped portions which are coupled together, and the frame portion is structured in a same manner as a strip-shaped portion of the plurality of strip-shaped portions of the wire grid polarizer.

[A17] The imaging element according to any one of [A11] to [A16], further including a plurality of photoelectric conversion units, wherein the photoelectric conversion unit is one of the plurality of photoelectric conversion units and the plurality of strip-shaped portions extends in a continuous manner above the plurality of photoelectric conversion units.

[A18] The imaging element according to [A17], further including: an on-chip lens between the wire grid polarizer and the photoelectric conversion unit.

[A19] The imaging element according to [A17], further including: an on-chip lens, wherein the wire grid polarizer is between the on-chip lens and the photoelectric conversion unit.

[A20] The imaging element according to any one of [A11] to [A19], further including: an insulation layer, wherein the wire grid polarizer is disposed on the insulation layer.

[A21] The imaging element according to any one of [A11] to [A20], further including: a groove portion located at an edge portion of the imaging element.

[A22] The imaging element according to [A21], wherein at least one of an insulating material or a light-shielding material is disposed within the groove portion.

[A23] The imaging element according to any one of [A11] to [A22], wherein the groove portion is disposed in the substrate.

[A24] The imaging element according to any one of [A11] to [A23], wherein the groove portion at least one of extends to the wire grid polarizer, extends to a flattening layer between the wire grid polarizer and the photoelectric conversion unit, or extends to a wiring layer disposed at a side of the substrate opposite to the light-incident side of the photoelectric conversion unit.

[A25] The imaging element according to any one of [A11] to [A24], further including: a drive circuit driving the photoelectric conversion unit formed on one surface of the substrate, wherein the photoelectric conversion unit is formed on another surface of the substrate.

[A26] The imaging element according to any one of [A11] to [A25], wherein the plurality of strip-shaped portions includes stacked layered structures each including a light reflection layer made from a first conducive material, an insulation layer, and a light-absorption layer made from a second conductive material.

[A27] The imaging element according to [A26], wherein the light reflection layer is electrically coupled to the substrate or the photoelectric conversion unit.

[A28] The imaging element according to any one of [A26] to [A27], wherein the insulation layer is formed on an entire top surface of the light reflection layer, and the light-absorption layer is formed on an entire top surface of the insulation layer.

[A29] An imaging apparatus including an imaging region and a plurality of imaging elements, each imaging element configured in a manner according to any one of [A11] to [A28].

[A30] A method of manufacturing an imaging element, the method including forming a photoelectric conversion unit on a substrate, forming a wire grid polarizer at a light-incident side of the photoelectric conversion unit, the wire grid polarizer including a plurality of strip-shaped portions, and forming a protective layer formed on the wire grid polarizer, wherein the wire grid polarizer includes air gaps between adjacent strip-shaped portions of the plurality of strip-shaped portions.

[B01] <<Imaging Element: Second Embodiment>>

An imaging element including:
a photoelectric conversion unit;

a wire grid polarizer that is disposed on the light incident side of the photoelectric conversion unit and has a line-and-space structure; and, a frame part surrounding the wire grid polarizer, wherein the frame part and line parts of the wire grid polarizer are coupled together, and the frame part is structured in the same manner as the line parts of the wire grid polarizer.

[B02] The imaging element according to [B01], wherein the line parts of the wire grid polarizer are formed from layered structures in which a light reflection layer made from a first conducive material, an insulation layer, and a light-absorption layer made from a second conductive material are layered from the photoelectric conversion unit side.

[B03] The imaging element according to [B02] wherein a foundation film is formed between the photoelectric conversion unit and the light reflection layer.

[B04] The imaging element according to [B02] or [B03], wherein an extension part of the light reflection layer is electrically connected to the substrate or the photoelectric conversion unit.

[B05] The imaging element according to any one of [B02] to [B04], wherein the insulation layer is formed on the entire top surface of the light reflection layer, and the light-absorption layer is formed on the entire top surface of the insulation layer.

[B06] The imaging element according to any one of [B01] to [B05], wherein a drive circuit driving the photoelectric conversion unit is formed on one surface of a substrate, the photoelectric conversion unit is formed on the other surface of the substrate, and a groove part with an insulating material or a light-shielding material embedded is formed at an edge portion of the imaging element in such a manner as to range from the one surface to the other surface of the substrate and further extend up to the lower side of the wire grid polarizer.

[C01] <<Imaging Apparatus: First Embodiment>>

An imaging apparatus including in an imaging region a plurality of imaging elements including:

a photoelectric conversion unit formed on a substrate;

a wire grid polarizer that is disposed on the light incident side of the photoelectric conversion unit and has a line-and-space structure; and a protective layer formed on the wire grid polarizer, wherein space parts of the wire grid polarizer are air gaps.

[C02] <<Imaging Apparatus: Second Embodiment>>

An imaging apparatus including in an imaging region a plurality of imaging elements including:

a photoelectric conversion unit;

a wire grid polarizer that is disposed on the light incident side of the photoelectric conversion unit and has a line-and-space structure; and a frame part surrounding the wire grid polarizer, wherein the frame part and line parts of the wire grid polarizer are coupled together, and the frame part is structured in the same manner as the line parts of the wire grid polarizer.

[D01] <<Imaging Apparatus>>

An imaging apparatus having a plurality of imaging elements including a photoelectric conversion unit formed on a substrate and a wire grid polarizer in an imaging region, wherein the wire grid polarizer is formed such that a plurality of belt-like, or strip shaped, layered structures in which a light reflection layer, an insulation layer, and a light-absorption layer are layered from the photoelectric conversion unit side is arranged in parallel with spacing therebetween, the insulation layer is formed on the entire top surface of the light reflection layer, and the light-absorption layer is formed on the entire top surface of the insulation layer.

[D02] The imaging apparatus according to [D01], wherein the light reflection layer and the light-absorption layer are common among the imaging elements.

[D03] The imaging apparatus according to [D01] or [D02], wherein a foundation film is formed between the photoelectric conversion unit and the light reflection layer.

[D04] <<Imaging Apparatus>>

An imaging apparatus having a plurality of imaging elements including a photoelectric conversion unit formed on a substrate and a wire grid polarizer in an imaging region, wherein a drive circuit driving the photoelectric conversion unit is formed on one surface of the substrate, the photoelectric conversion unit is formed on the other surface of the substrate, and a groove part with an insulating material or a light-shielding material embedded is formed at an edge portion of the imaging element in such a manner as to range from the one surface to the other surface of the substrate and further extend up to the lower side of the wire grid polarizer.

[D05] <<Imaging Element>>

An imaging element including a photoelectric conversion unit formed on a substrate and a wire grid polarizer, wherein the wire grid polarizer is formed such that a plurality of belt-like, or strip shaped, layered structures in which a light reflection layer, an insulation layer, and a light-absorption layer are layered from the photoelectric conversion unit side is arranged in parallel with spacing therebetween, the insulation layer is formed on the entire top surface of the light reflection layer, and the light-absorption layer is formed on the entire top surface of the insulation layer.

[D06] The imaging element according to [D05], wherein a foundation film is formed between the photoelectric conversion unit and the light reflection layer.

[D07] <<Imaging Element>>

An imaging element including a photoelectric conversion unit formed on a substrate and a wire grid polarizer, wherein a drive circuit driving the photoelectric conversion unit is formed on one surface of the substrate, the photoelectric conversion unit is formed on the other surface of the substrate, and a groove part with an insulating material or a light-shielding material embedded is formed at an edge portion in such a manner as to range from the one surface to the other surface of the substrate and further extend up to the lower side of the wire grid polarizer.

REFERENCE SIGNS LIST

10 Imaging apparatus
11 Imaging region
12 Optical black pixel region (OPB)
13 Peripheral region
21, 21A, and 21B Imaging element 22 Region occupied by imaging element
23 Region between imaging elements
24 Imaging element unit
31 Substrate
32 Drive circuit and wiring (wiring layer)
33 Inter-layer insulation film
34 Groove part
40 Photoelectric conversion unit
41 Photoelectric conversion region
42 First flattening film
43 Wavelength selection layer (color filter layer)
44 On-chip lens
45 Flattening layer (second flattening film)
46 Foundation insulation layer
46B First opening
47 Light-shielding layer
48 Third flattening film
50, 50A, and 50B Wire grid polarizer
51 Light reflection layer
51A Light reflection layer formative layer
51a Extension part of light reflection layer or light reflection layer formative layer
52 Insulation layer
52A Insulation layer formative layer
52B Second opening
53 Light-absorption layer
53A Light-absorption layer formative layer
53a Extension part of light-absorption layer or light-absorption layer formative layer
54 Line part (layered structure)
55 Space portion (gap between layered structures)
56 Protective layer
57 Second protective layer
58 Third protective layer
59 Frame part

What is claimed is:

1. An imaging element comprising:
a photoelectric conversion unit formed in a substrate;
a wire grid polarizer disposed at a light-incident side of the photoelectric conversion unit, the wire grid polarizer including a plurality of strip-shaped portions;
a first protective layer formed above the strip-shaped portions of the wire grid polarizer,
wherein the wire grid polarizer includes air gaps between adjacent strip-shaped portions of the plurality of strip-shaped portions;
a second protective layer formed between the strip-shaped portions of the wire grid polarizer and the first protective layer,
wherein each of the first protective layer and second protective layer covers both top portions of the strip-shaped portions and top portions of the air gaps; and
a third protective layer formed on side surfaces of the ship-shaped portions and on bottom portions of the air gaps.

2. The imaging element according to claim 1 wherein a refractive index of a material of the first protective layer is greater than a refractive index of a material of the second protective layer.

3. The imaging element according to claim 1, wherein the first protective layer includes SiN and the second protective layer includes at least one of $SiO_2$ or SiON.

4. The imaging element according to claim 1, further comprising:
a frame portion at least partially surrounding the wire grid polarizer, wherein the frame portion is coupled to the plurality of strip-shaped portions which are coupled together, and the frame portion is structured in a same manner as a strip-shaped portion of the plurality of strip-shaped portions of the wire grid polarizer.

5. The imaging element according to claim 1, further comprising a plurality of photoelectric conversion units, wherein the photoelectric conversion unit is one of the plurality of photoelectric conversion units and the plurality of strip-shaped portions extends in a continuous manner above the plurality of photoelectric conversion units.

6. The imaging element according to claim 5, further comprising:
an on-chip lens between the wire grid polarizer and the photoelectric conversion unit.

7. The imaging element according to claim 5, further comprising:
an on-chip lens, wherein the wire grid polarizer is between the on-chip lens and the photoelectric conversion unit.

8. The imaging element according to claim 1, further comprising:
an insulation layer, wherein the wire grid polarizer is disposed on the insulation layer.

9. The imaging element according to claim 1, further comprising:
a groove portion located at an edge portion of the imaging element.

10. The imaging element according to claim 9, wherein at least one of an insulating material or a light-shielding material is disposed within the groove portion.

11. The imaging element according to claim 9, wherein the groove portion is disposed in the substrate.

12. The imaging element according to claim 11, wherein the groove portion at least one of extends to the wire grid polarizer, extends to a flattening layer between the wire grid polarizer and the photoelectric conversion unit, or extends to a wiring layer disposed at a side of the substrate opposite to the light-incident side of the photoelectric conversion unit.

13. The imaging element according to claim 1, further comprising:
a drive circuit driving the photoelectric conversion unit formed on one surface of the substrate,
wherein the photoelectric conversion unit is formed on another surface of the substrate.

14. The imaging element according to claim 1, wherein the plurality of strip-shaped portions includes stacked layered structures each including a light reflection layer made from a first conducive material, an insulation layer, and a light-absorption layer made from a second conductive material.

15. The imaging element according to claim 14, wherein the light reflection layer is electrically coupled to the substrate or the photoelectric conversion unit.

16. The imaging element according to claim 14, wherein the insulation layer is formed on an entire top surface of the light reflection layer, and the light-absorption layer is formed on an entire top surface of the insulation layer.

17. The imaging element according to claim 1, wherein a bottom surface of the second protective layer is convex towards top portions of the air gaps.

18. The imaging element according to claim 1, wherein a bottom surface of the second protective layer is concave towards the first protective layer.

19. A method of manufacturing an imaging element, the method comprising:

forming a photoelectric conversion unit in a substrate;

forming a wire grid polarizer at a light-incident side of the photoelectric conversion unit, the wire grid polarizer including a plurality of strip-shaped portions;

forming a first protective layer above the strip-shaped portions of the wire grid polarizer, wherein the wire grid polarizer includes air gaps between adjacent strip-shaped portions of the plurality of strip-shaped portions;

forming a second protective layer between the strip-shaped portions of the wire grid polarizer and the first protective layer, wherein each of the first protective layer and second protective layer covers both top portions of the strip-shaped portions and top portions of the air gaps; and forming a third protective layer on side surfaces of the ship-shaped portions and on bottom portions of the air gaps.

20. An imaging apparatus including an imaging region and a plurality of imaging elements, each imaging element including:

a photoelectric conversion unit formed in a substrate;

a wire grid polarizer disposed at a light-incident side of the photoelectric conversion unit, the wire grid polarizer including a plurality of strip-shaped portions;

a first protective layer formed above the strip-shaped portions of the wire grid polarizer, wherein the wire grid polarizer includes air gaps between adjacent strip-shaped portions of the plurality of strip-shaped portions;

a second protective layer formed between the strip-shaped portions of the wire grid polarizer and the first protective layer, wherein each of the first protective layer and second protective layer covers both top portions of the strip-shaped portions and top portions of the air gaps; and a third protective layer formed on side surfaces of the ship-shaped portions and on bottom portions of the air gaps.

* * * * *